US012740279B2

(12) United States Patent
Long et al.

(10) Patent No.: US 12,740,279 B2
(45) Date of Patent: Sep. 15, 2026

(54) DISPLAY SUBSTRATE AND PREPARATION METHOD THEREFOR, AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Yixuan Long, Beijing (CN); Tianyi Cheng, Beijing (CN); Meng Li, Beijing (CN); Tinghua Shang, Beijing (CN); Biao Liu, Beijing (CN); Jiaxing Chen, Beijing (CN); Zuoji Niu, Beijing (CN); Peng Xu, Beijing (CN); Yi Qu, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 602 days.

(21) Appl. No.: 18/028,509

(22) PCT Filed: Apr. 29, 2022

(86) PCT No.: PCT/CN2022/090541

§ 371 (c)(1),
(2) Date: Mar. 24, 2023

(87) PCT Pub. No.: WO2023/206462

PCT Pub. Date: Nov. 2, 2023

(65) Prior Publication Data

US 2024/0306461 A1 Sep. 12, 2024

(51) Int. Cl.
*H10K 59/35* (2023.01)
*H10K 59/12* (2023.01)
(Continued)

(52) U.S. Cl.
CPC ....... *H10K 59/353* (2023.02); *H10K 59/1201* (2023.02); *H10K 59/1213* (2023.02); *H10K 59/1216* (2023.02); *H10K 59/131* (2023.02)

(58) Field of Classification Search
CPC ........... H10K 59/1201; H10K 59/1213; H10K 59/1216; H10K 59/131; H10K 59/353; G09G 3/30
See application file for complete search history.

(56) References Cited

U.S. PATENT DOCUMENTS 10,573,236 B1 2/2020 Gao et al.
11,158,694 B2 * 10/2021 Wang .................. H10K 59/123
(Continued)

FOREIGN PATENT DOCUMENTS

CN 102903732 A 1/2013
CN 106782416 A 5/2017
(Continued)

OTHER PUBLICATIONS

Notice of Allowance dated Aug. 1, 2023 for Chinese Patent Application No. 202211651921.5 and English Translation.
(Continued)

*Primary Examiner* — Telly D Green

(57) ABSTRACT

Disclosed are a display substrate and a preparation method therefor, and a display apparatus. The display substrate includes a display region and a bonding region, wherein the display region includes M pixel rows arranged sequentially, at least one pixel row includes a scan signal line and a plurality of sub-pixels arranged sequentially along an extension direction of the scan signal line, at least one sub-pixel includes a pixel drive circuit connected with the scan signal line, the pixel drive circuit at least includes a storage capacitor and a first transistor as a first initialization transistor, and the scan signal line at least includes a second scan signal line that controls the first transistor to be turned on or
(Continued)

off, and in the at least one pixel row, the second scan signal line is arranged on a side of the storage capacitor close to a display region boundary.

20 Claims, 22 Drawing Sheets

(51) Int. Cl.
*H10K 59/121* (2023.01)
*H10K 59/131* (2023.01)

(56) References Cited

U.S. PATENT DOCUMENTS

| | | | | |
|---|---|---|---|---|
| 2014/0184479 | A1 | 7/2014 | Wu | |
| 2018/0158417 | A1 | 6/2018 | Xiang et al. | |
| 2019/0278145 | A1 | 9/2019 | Tanaka et al. | |
| 2019/0303637 | A1 | 10/2019 | Wang et al. | |
| 2019/0377923 | A1 | 12/2019 | Chen et al. | |
| 2021/0056894 | A1* | 2/2021 | Yang .................... | G09G 3/2014 |
| 2021/0280132 | A1* | 9/2021 | Gao ..................... | H10K 59/121 |
| 2021/0358347 | A1 | 11/2021 | Jiang et al. | |
| 2021/0367021 | A1 | 11/2021 | Yang et al. | |
| 2022/0310010 | A1 | 9/2022 | Cheng et al. | |
| 2022/0344437 | A1 | 10/2022 | Wang et al. | |
| 2022/0399423 | A1 | 12/2022 | Du et al. | |
| 2023/0154427 | A1 | 5/2023 | Wang et al. | |

FOREIGN PATENT DOCUMENTS

| | | | | | |
|---|---|---|---|---|---|
| CN | 107481669 | A | | 12/2017 | |
| CN | 108509899 | A | | 9/2018 | |
| CN | 108806578 | A | | 11/2018 | |
| CN | 109346009 | A | | 2/2019 | |
| CN | 109671742 | A | | 4/2019 | |
| CN | 109686311 | A | | 4/2019 | |
| CN | 110379314 | A | | 10/2019 | |
| CN | 111128080 | A | * | 5/2020 | ........... G09G 3/3266 |
| CN | 111192903 | A | | 5/2020 | |
| CN | 111710239 | A | | 9/2020 | |
| CN | 111796462 | A | | 10/2020 | |
| CN | 101763834 | A | | 6/2021 | |
| CN | 113196374 | A | | 7/2021 | |
| CN | 113196494 | A | | 7/2021 | |
| CN | 113253530 | A | | 8/2021 | |
| CN | 113327963 | A | | 8/2021 | |
| CN | 215527732 | U | | 1/2022 | |
| CN | 114267283 | A | | 4/2022 | |

OTHER PUBLICATIONS

Office Action dated May 4, 2023 for Chinese Patent Application No. 202211651921.5 and English Translation.

* cited by examiner

DISPLAY SUBSTRATE AND PREPARATION METHOD THEREFOR, AND DISPLAY APPARATUS

CROSS-REFERENCE TO RELATED APPLICATION

The present application is a U.S. National Phase Entry of International Application No. PCT/CN2022/090541 having an international filing date of Apr. 29, 2022. The entire contents of the above-identified application are hereby incorporated by reference.

TECHNICAL FIELD

The present disclosure relates to, but is not limited to, the field of display technologies, and particularly to a display substrate and a preparation method therefor, and a display apparatus.

BACKGROUND

An Organic Light Emitting Diode (OLED for short) and a Quantum dot Light Emitting Diode (QLED for short) are active light emitting display devices and have advantages such as self-luminescence, a wide viewing angle, a high contrast ratio, low power consumption, an extremely high response speed, lightness and thinness, flexibility, and a low cost. With constant development of display technologies, a flexible display apparatus (Flexible Display) that uses an OLED or a QLED as a light emitting device and performs signal control by a Thin Film Transistor (TFT for short) has become a mainstream product in the field of display at present.

SUMMARY

The following is a summary of subject matters described herein in detail. The summary is not intended to limit the protection scope of claims.

In one aspect, the present disclosure provides a display substrate, including a display region and a bonding region located on a side of the display region, wherein the display region includes M pixel rows arranged sequentially, and M is a positive integer greater than 1; at least one pixel row includes a scan signal line and a plurality of sub-pixels arranged sequentially along an extension direction of the scan signal line, at least one sub-pixel includes a pixel drive circuit connected with the scan signal line, the pixel drive circuit at least includes a storage capacitor and a plurality of transistors, the plurality of transistors at least include a first transistor as a first initialization transistor, and the scan signal line at least includes a second scan signal line, and the second scan signal line is configured to control the first transistor to be turned on or off, and in at least one pixel row, the second scan signal line is arranged on a side of the storage capacitor close to a display region boundary, and the display region boundary is an edge of the display region close to the bonding region.

In an exemplary implementation mode, a first electrode of the first transistor is connected with a first initial signal line, and the first initial signal line is arranged on a side of the storage capacitor close to the display region boundary.

In an exemplary implementation mode, an edge of a first initial signal line in an M-th pixel row close to a side of the bonding region forms a pixel drive circuit boundary.

In an exemplary implementation mode, the pixel drive circuit boundary is located on a side of the display region boundary away from the bonding region.

In an exemplary implementation mode, a distance between the pixel drive circuit boundary and the display region boundary is 6 μm to 10 μm.

In an exemplary implementation mode, the plurality of transistors further include a seventh transistor as a second initialization transistor, and the scan signal line further includes a first scan signal line, the first scan signal line is configured to control the seventh transistor to be turned on or off, and the first scan signal line is arranged on a side of the storage capacitor away from the display region boundary.

In an exemplary implementation mode, a first electrode of the seventh transistor is connected with a second initial signal line, and the second initial signal line is arranged on a side of the storage capacitor away from the display region boundary.

In an exemplary implementation mode, an orthographic projection of a second initial signal line in an i-th pixel row on the display substrate is at least partially overlapped with an orthographic projection of a second scan signal line in an (i−1)-th pixel row on the display substrate, and i=2, 3, . . . , M.

In an exemplary implementation mode, the plurality of transistors further include a second transistor as a compensation transistor and a fourth transistor as a data writing transistor, and the scan signal line further includes a third scan signal line that controls the fourth transistor to be turned on or off, and a fourth scan signal line that controls the compensation transistor to be turned on or off, and the third scan signal line and the fourth scan signal line are arranged on a side of the storage capacitor close to the display region boundary.

In an exemplary implementation mode, the third scan signal line is arranged on a side of the fourth scan signal line close to the display region boundary.

In an exemplary implementation mode, a first scan signal line in an i-th pixel row and a third scan signal line in an (i−1)-th pixel row are of an integral structure, and i=2, 3, . . . , M.

In an exemplary implementation mode, the plurality of transistors further include a fifth transistor and a sixth transistor, and the display substrate further includes a light emitting control line, wherein the light emitting control line is configured to control the fifth transistor and the sixth transistor to be turned on or off, and the light emitting control line is arranged on a side of the storage capacitor away from the display region boundary.

In an exemplary implementation mode, the plurality of transistors further include a second transistor as a compensation transistor, a third transistor as a drive transistor, a fourth transistor as a data writing transistor, a fifth transistor and a sixth transistor as light emitting transistors, and a seventh transistor as a second initialization transistor; and the first transistor, the second transistor, and the fourth transistor are arranged on a side of the third transistor close to the display region boundary, and the fifth transistor, the sixth transistor, and the seventh transistor are arranged on a side of the third transistor away from the display region boundary.

In an exemplary implementation mode, the first transistor and second transistor are oxide transistors, and the third transistor to the seventh transistor are low-temperature poly silicon transistors.

In an exemplary implementation mode, in a plane perpendicular to the display substrate, the display substrate includes a drive circuit layer arranged on a base substrate and a light emitting structure layer arranged on a side of the drive circuit layer away from the base substrate; the drive circuit layer includes a first semiconductor layer, a first conductive layer, a second conductive layer, a second semiconductor layer, and a third conductive layer which are arranged along a direction away from the base substrate; and the first semiconductor layer at least includes active layers of the plurality of poly silicon transistors, the first conductive layer at least includes a first scan signal line, a third scan signal line, gate electrodes of the plurality of poly silicon transistors, and a first electrode plate of the storage capacitor, the second conductive layer at least includes a second scan signal line, a fourth scan signal line, a first initial signal line, gate electrodes of a plurality of oxide transistors, and a second electrode plate of the storage capacitor, the second semiconductor layer at least includes active layers of the plurality of oxide transistors, and the third conductive layer at least includes a second initial signal line.

In another aspect, the present disclosure also provides a display apparatus, including the aforementioned display substrate.

In yet another aspect, the present disclosure also provides a preparation method of a display substrate, wherein the display substrate includes a display region and a bonding region located on a side of the display region, the display region includes M pixel rows, and M is a positive integer greater than 1; at least one pixel row includes a scan signal line and a plurality of sub-pixels arranged sequentially along an extension direction of the scan signal line, at least one sub-pixel includes a pixel drive circuit connected with the scan signal line, the pixel drive circuit at least includes a storage capacitor and a plurality of transistors, the plurality of transistors at least include a first transistor as a first initialization transistor, and the scan signal line at least includes a second scan signal line, and the second scan signal line is configured to control the first transistor to be turned on or off, and the preparation method includes: forming a pixel drive circuit and a second scan signal line in at least one pixel row, wherein the second scan signal line is arranged on a side of the storage capacitor close to a display region boundary, and the display region boundary is a boundary of the display region close to the bonding region.

Other aspects may be understood upon reading and understanding drawings and detailed description.

BRIEF DESCRIPTION OF DRAWINGS

The accompanying drawings are used for providing understanding of technical solutions of the present disclosure, and constitute a part of the specification. They are used for explaining the technical solutions of the present disclosure together with the embodiments of the present disclosure, but do not constitute a limitation on the technical solutions of the present disclosure.

Figure 1:
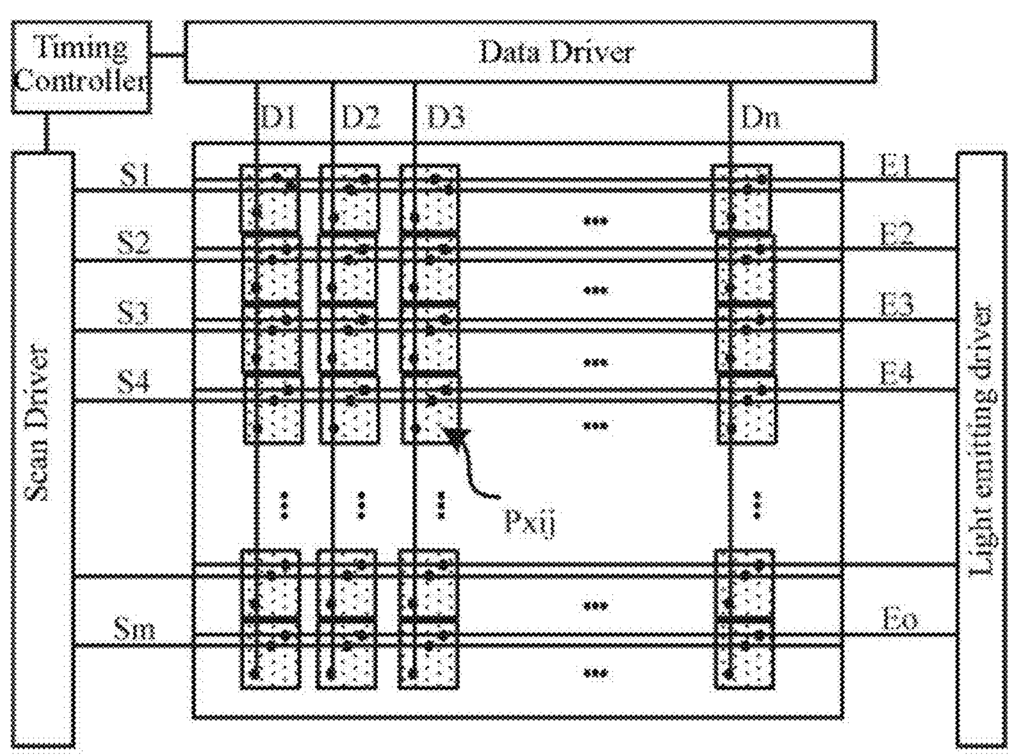
FIG. 1 is a schematic diagram of a structure of a display apparatus.

Reference signs are described as follows.

| | | |
|---|---|---|
| 11-first active layer; | 12-second active layer; | 13-third active layer; |
| 14-fourth active layer; | 15-fifth active layer; | 16-sixth active layer; |
| 17-seventh active layer; | 21-first scan signal line; | 22-light emitting control line; |
| 23-third scan signal line; | 24-first electrode plate; | 31-first initial signal line; |
| 32-second scan signal line | 33-fourth scan signal line; | 34-second electrode plate; |
| 35-opening; | 40-storage capacitor; | 51-first connection electrode; |
| 52-second connection electrode; | 53-third connection electrode; | 54-fourth connection electrode; |
| 55-fifth connection electrode; | 56-sixth connection electrode; | 57-second initial signal line; |
| 61-data signal line; | 62-first power supply line; | 63-anode connection electrode; |
| 90-anode; | 100-display region; | 101-base substrate; |
| 102-drive circuit layer; | 103-light emitting structure layer; | 104-encapsulation structure layer; |
| 200-bonding region; | 300-border region; | 400-pixel opening. |

DETAILED DESCRIPTION

To make objectives, technical solutions, and advantages of the present disclosure clearer, the embodiments of the present disclosure will be described in detail with reference to the accompanying drawings. It is to be noted that implementation modes may be implemented in a plurality of different forms. Those of ordinary skills in the art may easily understand such a fact that modes and contents may be transformed into various forms without departing from the purpose and scope of the present disclosure. Therefore, the present disclosure should not be explained as being limited to contents described in following implementation modes only. The embodiments in the present disclosure and features in the embodiments may be combined randomly with each other without conflict.

A scale of the drawings in the present disclosure may be used as a reference in an actual process, but is not limited thereto. For example, a width-length ratio of a channel, a thickness and a pitch of each film layer, and a width and a pitch of each signal line may be adjusted according to actual needs. A quantity of pixels in a display substrate and a quantity of sub-pixels in each pixel are not limited to numbers shown in the drawings. The drawings described in the present disclosure are schematic structural diagrams only, and one mode of the present disclosure is not limited to shapes, numerical values, or the like shown in the drawings.

Ordinal numerals such as "first", "second", and "third" in the specification are set to avoid confusion of constituent elements, but not to set a limit in quantity.

In the specification, for convenience, wordings indicating orientations or positional relationships, such as "middle", "up", "down", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions for describing various constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, it may be a fixed connection, a detachable connection, or an integrated connection. It may be a mechanical connection or an electrical connection. It may be a direct mutual connection, or an indirect connection through middleware, or communication inside two elements. Those of ordinary skill in the art may understand specific meanings of these terms in the present disclosure according to specific situations.

In the specification, a transistor refers to an element which includes at least three terminals, i.e., a gate electrode, a drain electrode, and a source electrode. The transistor has a channel region between the drain electrode (drain electrode terminal, drain region, or drain) and the source electrode (source electrode terminal, source region, or source), and a current can flow through the drain electrode, the channel region, and the source electrode. It is to be noted that, in the specification, the channel region refers to a region through which the current mainly flows.

In the specification, a first electrode may be a drain electrode, and a second electrode may be a source electrode. Or, a first electrode may be a source electrode, and a second electrode may be a drain electrode. In a case that transistors with opposite polarities are used, a case that a direction of a current is changed during operation of a circuit, or the like, functions of the "source electrode" and the "drain electrode" are sometimes interchangeable. Therefore, the "source electrode" and the "drain electrode" are interchangeable, and a "source terminal" and a "drain terminal" are interchangeable in the specification.

In the specification, an "electrical connection" includes a case that constituent elements are connected together through an element with a certain electrical effect. The "element with the certain electrical effect" is not particularly limited as long as electrical signals may be sent and received between the connected constituent elements. Examples of the "element with the certain electrical effect" not only include electrodes and wirings, but also include switching elements such as transistors, resistors, inductors, capacitors, and other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 800 and below 100°, and thus also includes a state in which the angle is above 850 and below 95°.

In the specification, a "film" and a "layer" are interchangeable. For example, a "conductive layer" may be replaced with a "conductive film" sometimes. Similarly, an "insulation film" may be replaced with an "insulation layer" sometimes.

A triangle, rectangle, trapezoid, pentagon, hexagon, or the like in the specification is not strictly defined, and it may be an approximate triangle, rectangle, trapezoid, pentagon, hexagon, or the like. There may be some small deformation caused by tolerance, and there may be a chamfer, an arc edge, and deformation, etc.

In the present disclosure, "about" refers to that a boundary is defined not so strictly and numerical values within process and measurement error ranges are allowed.

FIG. 1 is a schematic diagram of a structure of a display apparatus. As shown in FIG. 1, the display apparatus may include a timing controller, a data driver, a scan driver, a light emitting driver, and a pixel array, wherein the timing controller is connected with the data driver, the scan driver, and the light emitting driver, respectively, the data driver is connected with a plurality of data signal lines (D1 to Dn) respectively, the scan driver is connected with a plurality of scan signal lines (S1 to Sm) respectively, and the light emitting driver is connected with a plurality of light emitting signal lines (E1 to Eo) respectively. The pixel array may include a plurality of sub-pixels Pxij, wherein i and j may be natural numbers, at least one sub-pixel Pxij may include a circuit unit and a light emitting device connected with the circuit unit, and the circuit unit may include at least one scan signal line, at least one data signal line, at least one light emitting signal line, and a pixel drive circuit. In an exemplary implementation mode, the timing controller may provide a gray value and a control signal, which are suitable for a specification of the data driver, to the data driver, may provide a clock signal, a scan start signal, etc., which are suitable for a specification of the scan driver, to the scan driver, and may provide a clock signal, an emission stop signal, etc., which are suitable for a specification of the light emitting driver, to the light emitting driver. The data driver may generate a data voltage to be provided to the data signal lines D1, D2, D3, . . . , and Dn by using the gray value and the control signal that are received from the timing controller. For example, the data driver may sample the gray value by using the clock signal and apply a data voltage corresponding to the gray value to the data signal lines D1 to Dn by taking a pixel row as a unit, wherein n may be a natural number. The scan driver may receive the clock signal, the scan start signal, etc., from the timing controller to generate a scan signal to be provided to the scan signal lines S1, S2, S3, . . . , and Sm. For example, the scan driver may provide a scan signal with an on-level pulse to the scan signal lines S1 to Sm sequentially. For example, the scan driver may be constructed in a form of a shift register and may generate a scan signal in a manner in which a scan start signal provided in a form of an on-level pulse is transmitted to a next-stage circuit sequentially under control of the clock signal, wherein m may be a natural number. The light emitting driver may receive a clock signal, an emission stop signal, etc., from the timing controller to generate an emission signal to be provided to the light emitting signal lines E1, E2, E3, . . . , and Eo. For example, the light emitting driver may provide an emission signal with an off-level pulse to the light emitting signal lines E1 to Eo sequentially. For example, the light emitting driver may be constructed in a form of a shift register and may generate an emission signal in a manner in which an emission stop signal provided in a form of an off-level pulse is transmitted to a next-stage circuit sequentially under control of the clock signal, wherein o may be a natural number.

Figure 2:
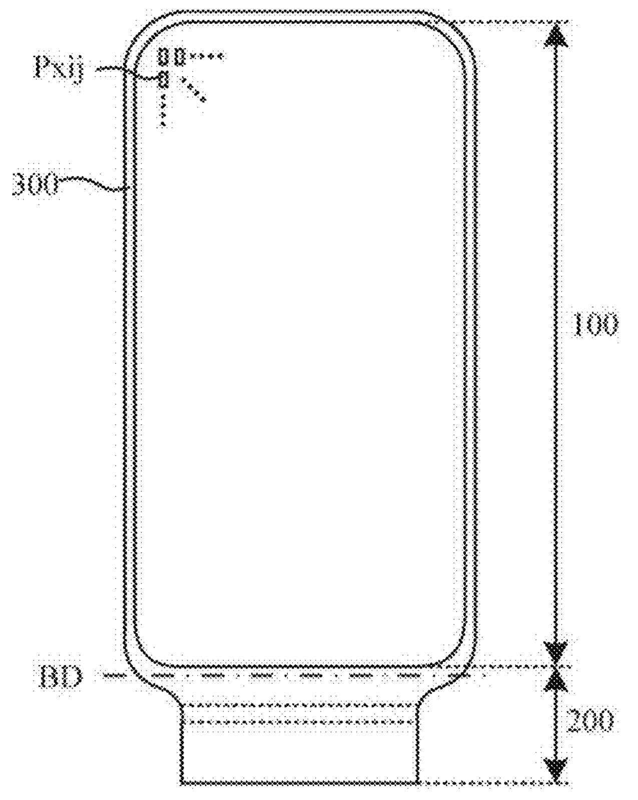
FIG. 2 is a schematic diagram of a structure of a display substrate.

FIG. 2 is a schematic diagram of a structure of a display substrate. As shown in FIG. 2, the display substrate may include a display region 100, a bonding region 200 located on one side of the display region 100, and a border region 300 located on another side of the display region 100. In an exemplary implementation mode, the display region 100 may be a planar region including a plurality of sub-pixels Pxij that form a pixel array, the plurality of sub-pixels Pxij are configured to display a dynamic picture or a static image, and the display region 100 may be referred to as an Active Area (AA). In an exemplary implementation mode, the display substrate may be a flexible substrate, so that the display substrate may be deformable, for example, curled, bent, folded, or rolled. In an exemplary implementation mode, the display substrate may further include a display region boundary BD, which may be an edge of the display region 100 on a side close to the bonding region 200.

In an exemplary implementation mode, the bonding region 200 may include a fan-out region, a bending region, a drive chip region, and a bonding pin region arranged sequentially along a direction away from the display region, wherein the fan-out region is connected to the display region and includes a plurality of data fan-out lines, and a data fan-out line is configured to connect a data signal line (Data Line) of the display region in a Fan-out trace manner. The bending region is connected to the fan-out region and may include a composite insulation layer provided with a groove, and is configured to bend the bonding region to a back of the display region. The drive chip region may include an Integrated Circuit (IC for short) and is configured to be connected with the plurality of data fan-out lines. The bonding pin region may include a Bonding Pad, and is configured to be bonded to an external Flexible Printed Circuit board (FPC for short).

In an exemplary implementation mode, the border region 300 may include a circuit region, a power supply line region, and a crack dam region, and a cutting region which are sequentially arranged along the direction away from the display region. The circuit region is connected to the display region 100 and may at least include a gate drive circuit, and the gate drive circuit is connected with a first scan signal line, a second scan signal line, a third scan signal line, and a light emitting control line of a pixel drive circuit in the display region. The power supply line region is connected with the circuit region and may at least include a power supply lead line, and the power supply lead line extends along a direction parallel to an edge of the display region and is connected with a cathode in the display region. The crack dam region is connected to the power supply line region and may at least include a plurality of cracks arranged on the composite insulation layer. The cutting region is connected to the crack dam region and may at least include a cutting groove arranged on the composite insulation layer, and the cutting groove is configured that a cutting device cuts along the cutting groove respectively after preparation of all film layers of the display substrate are completed.

In an exemplary implementation mode, the fan-out region in the bonding region 200 and the power supply line region in the border region 300 may be provided with a first isolation dam and a second isolation dam, the first isolation dam and the second isolation dam may extend along the direction parallel to the edge of the display region, thus forming an annular structure surrounding the display region, wherein the edge of the display region is an edge on a side of the display region, the bonding region, or the border region.

Figure 3:
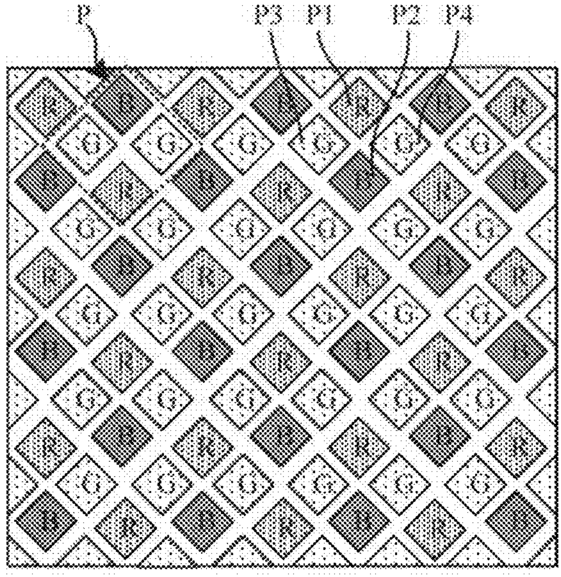
FIG. 3 is a schematic diagram of a planar structure of a display region in a display substrate.

FIG. 3 is a schematic diagram of a planar structure of a display region in a display substrate. As shown in FIG. 3, the display substrate may include a plurality of pixel units P arranged in a matrix. At least one pixel unit P may include a first sub-pixel P1 emitting light of a first color, a second sub-pixel P2 emitting light of a second color, and a third sub-pixel P3 and a fourth sub-pixel P4 emitting light of a third color. Each sub-pixel may include a circuit unit and a light emitting device, wherein the circuit unit may at least include a pixel drive circuit which is connected with a scan signal line, a data signal line, and a light emitting signal line respectively, and the pixel drive circuit is configured to receive a data voltage transmitted by the data signal line and output a corresponding current to the light emitting device under control of the scan signal line and the light emitting signal line. The light emitting device in each sub-pixel is connected with a pixel drive circuit of a sub-pixel where the light emitting device is located, and is configured to emit light with corresponding brightness in response to a current output by the pixel drive circuit of the sub-pixel where the light emitting device is located.

In an exemplary implementation mode, the first sub-pixel P1 may be a red sub-pixel (R) emitting red light, the second sub-pixel P2 may be a blue sub-pixel (B) emitting blue light, and the third sub-pixel P3 and the fourth sub-pixel P4 may be green sub-pixels (G) emitting green light. In an exemplary implementation mode, a shape of a sub-pixel may be a rectangle, a diamond, a pentagon, or a hexagon. The four sub-pixels may be arranged in a manner of diamond to form an RGBG pixel arrangement. In other exemplary implementation modes, the four sub-pixels may be arranged side by side horizontally, side by side vertically, or in a manner to form a square, which is not limited in the present disclosure.

In an exemplary implementation mode, a pixel unit may include three sub-pixels, wherein the three sub-pixels may be arranged side by side horizontally, side by side vertically, or in a manner like a Chinese character "品", which is not limited in the present disclosure.

Figure 4:
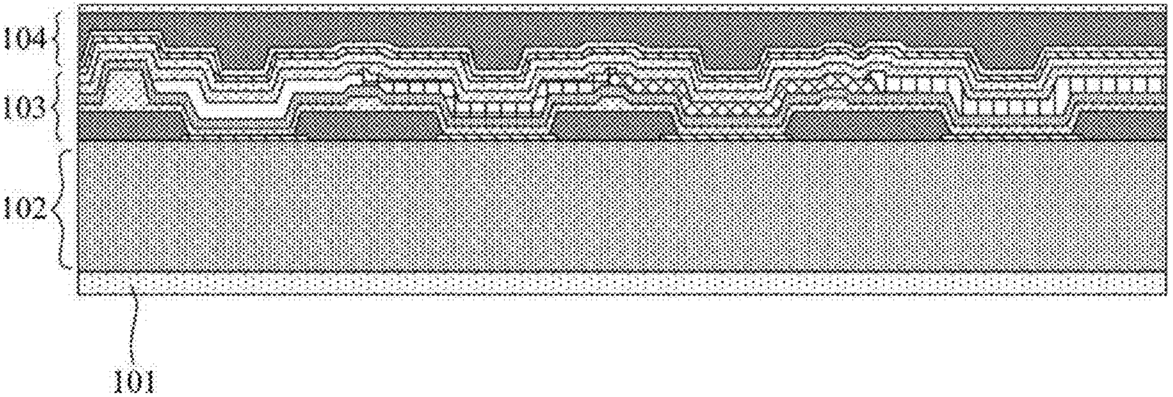
FIG. 4 is a schematic diagram of a sectional structure of a display region in a display substrate.

FIG. 4 is a schematic diagram of a sectional structure of a display region in a display substrate, illustrating a structure of four sub-pixels in the display region. As shown in FIG. 4, on a plane perpendicular to the display substrate, the display substrate may include a drive circuit layer 102 arranged on a base substrate 101, a light emitting structure layer 103 arranged on a side of the drive circuit layer 102 away from the base substrate 101, and an encapsulation structure layer 104 arranged on a side of the light emitting structure layer 103 away from the base substrate 101. In some possible implementations, the display substrate may include another film layer, such as a touch structure layer, which is not limited here in the present disclosure.

In an exemplary implementation mode, the base substrate 101 may be a flexible base substrate, or may be a rigid base substrate. The drive circuit layer 102 of each sub-pixel may include a pixel drive circuit composed of a plurality of transistors and a storage capacitor. The light emitting structure layer 103 of each sub-pixel may include a light emitting device composed of a plurality of film layers, wherein the plurality of film layers may at least include an anode, a pixel definition layer, an organic emitting layer, and a cathode. The anode is connected with the pixel drive circuit, the organic emitting layer is connected with the anode, the cathode is connected with the organic emitting layer, and the organic emitting layer emits light of a corresponding color under drive of the anode and the cathode. The encapsulation layer 104 may include a first encapsulation layer, a second encapsulation layer, and a third encapsulation layer that are stacked, wherein the first encapsulation layer and the third encapsulation layer may be made of an inorganic material, the second encapsulation layer may be made of an organic material, and the second encapsulation layer is arranged between the first encapsulation layer and the third encapsulation layer to form a laminated structure of an inorganic material/an organic material/an inorganic material and ensure that external water vapor cannot enter the light emitting structure layer 103.

In an exemplary implementation mode, the organic emitting layer may include an Emitting Layer (EML), and any one or more of following layers: a Hole Injection Layer (HIL), a Hole Transport Layer (HTL), an Electron Block Layer (EBL), a Hole Block Layer (HBL), an Electron Transport Layer (ETL), and an Electron Injection Layer (EIL). In an exemplary implementation mode, one or more layers of hole injection layers, hole transport layers, electron block layers, hole block layers, electron transport layers, and electron injection layers of all sub-pixels may be a common layer connected together. Emitting layers of adjacent sub-pixels may be overlapped slightly, or may be isolated from each other.

Figure 5:
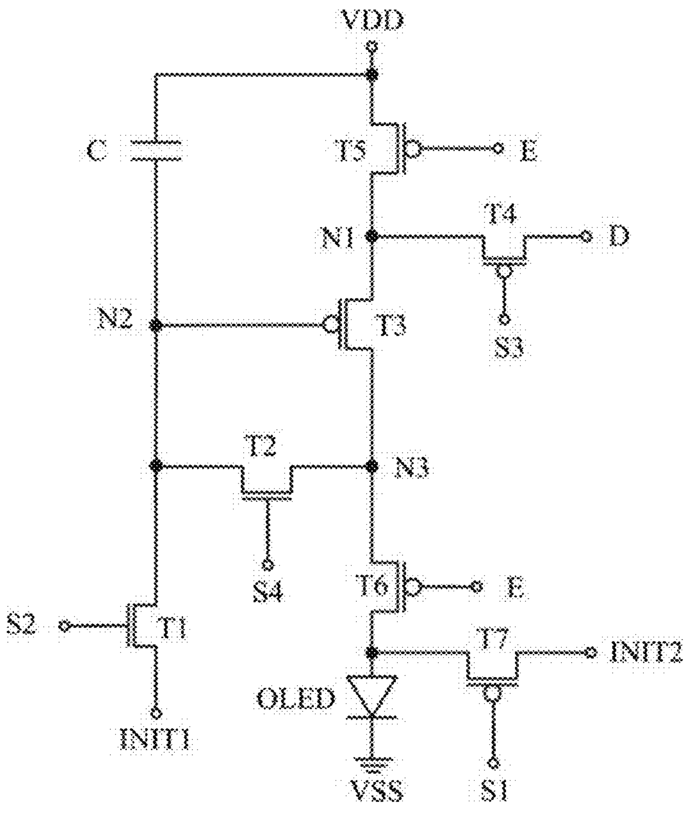
FIG. 5 is a schematic diagram of an equivalent circuit of a pixel drive circuit.

FIG. 5 is a schematic diagram of an equivalent circuit of a pixel drive circuit. In an exemplary implementation mode, the pixel drive circuit may have a structure of 3T1C, 4T1C, 5T1C, 5T2C, 6T1C, 7T1C, or 8T1C. As shown in FIG. 5, the pixel drive circuit may include seven transistors (a first transistor T1 to a seventh transistor T7) and one storage capacitor C, and the pixel drive circuit is respectively connected with ten signal lines (a data signal line D, a first scan signal line S1, a second scan signal line S2, a third scan signal line S3, a fourth scan signal line S4, a light emitting signal line E, a first initial signal line INIT1, a second initial signal line INIT1, a first power supply line VDD, and a second power supply line VSS).

In an exemplary implementation mode, the pixel drive circuit may include a first node N1, a second node N2, and a third node N3. Among them, the first node N1 is respectively connected with a first electrode of the third transistor T3, a second electrode of the fourth transistor T4, and a second electrode of the fifth transistor T5, the second node N2 is respectively connected with a second electrode of the first transistor T1, a control electrode of the third transistor T3, and a second end of the storage capacitor C, and the third node N3 is respectively connected with a second electrode of the second transistor T2, a second electrode of the third transistor T3, and a first electrode of the sixth transistor T6.

In an exemplary implementation mode, a first end of the storage capacitor C is connected with the first power supply line VDD, and the second end of the storage capacitor C is connected with the second node N2, i.e., the second end of the storage capacitor C is connected with the control electrode of the third transistor T3.

In an exemplary implementation mode, a control electrode of the first transistor T1 is connected with the second scan signal line S2, a first electrode of the first transistor T1 is connected with the first initial signal line INIT1, and the second electrode of the first transistor T1 is connected with the second node N2. When a turned-on scan signal is applied to the second scan signal line S2, the first transistor T1 transmits a first initialization voltage to the second end of the storage capacitor C to initialize the storage capacitor C.

In an exemplary implementation mode, a control electrode of the second transistor T2 is connected with the fourth scan signal line S4, a first electrode of the second transistor T2 is connected with the second electrode of the first transistor T1, and the second electrode of the second transistor T2 is connected with the third node N3. When a turned-on scan signal is applied to the fourth scan signal line S4, the second transistor T2 enables the control electrode of the third transistor T3 to be connected with the second electrode of the third transistor T3.

In an exemplary implementation mode, the control electrode of the third transistor T3 is connected with the second node N2, namely the control electrode of the third transistor T3 is connected with the second end of the storage capacitor C, the first electrode of the third transistor T3 is connected with the first node N1, and the second electrode of the third transistor T3 is connected with the third node N3. The third transistor T3 may be referred to as a drive transistor, and the third transistor T3 determines a size of a drive current flowing between the first power supply line VDD and a light emitting device according to a potential difference between the control electrode and the first electrode of the third transistor T3.

In an exemplary implementation mode, a control electrode of the fourth transistor T4 is connected with the third scan signal line S3, a first electrode of the fourth transistor T4 is connected with the data signal line D, and the second electrode of the fourth transistor T4 is connected with the first node N1. When a turned-on scan signal is applied to the third scan signal line S3, the fourth transistor T4 enables a data voltage of the data signal line D to be input to the first node N1.

In an exemplary implementation mode, a control electrode of the fifth transistor T5 is connected with the light emitting signal line EM, a first electrode of the fifth transistor T5 is connected with the first power supply line VDD, and the second electrode of the fifth transistor T5 is connected with the first node N1. A control electrode of the sixth transistor T6 is connected with the light emitting signal line E, the first electrode of the sixth transistor T6 is connected with the third node N3, and a second electrode of the sixth transistor T6 is connected with a first electrode of the light emitting device. When a turned-on light emitting signal is applied to the light emitting signal line E, the fifth transistor T5 and the sixth transistor T6 enable the light emitting device to emit light by forming a drive current path between the first power supply line VDD and the light emitting device.

In an exemplary implementation mode, a control electrode of the seventh transistor T7 is connected with the first scan signal line S1, a first electrode of the seventh transistor T7 is connected with the second initial signal line INIT2, and a second electrode of the seventh transistor T7 is connected with the first electrode of the light emitting device. When a turned-on scan signal is applied to the first scan signal line S1, the seventh transistor T7 transmits a second initial voltage to the first electrode of the light emitting device so as to initialize a charge amount accumulated in the first electrode of the light emitting device or release a charge amount accumulated in the first electrode of the light emitting device.

In an exemplary implementation mode, the light emitting device may be an OLED including a first electrode (anode), an organic emitting layer, and a second electrode (cathode) which are stacked, or may be a QLED including a first electrode (anode), a quantum dot emitting layer, and a second electrode (cathode) which are stacked.

In an exemplary implementation mode, a second electrode of the light emitting device is connected with the second power supply line VSS, a signal of the second power supply line VSS is a low-level signal, and a signal of the first power supply line VDD is a high-level signal continuously provided.

In an exemplary implementation mode, the first transistor T1 to the seventh transistor T7 may be P-type transistors or N-type transistors. Use of a same type of transistors in a pixel drive circuit may simplify a process flow, reduce process difficulties of a display panel, and improve a product yield. In some possible implementation modes, the first transistor T1 to the seventh transistor T7 may include a P-type transistor and an N-type transistor.

In an exemplary implementation mode, the first transistor T1 to the seventh transistor T7 may be low-temperature poly silicon transistors, or may be oxide transistors, or may be low-temperature poly silicon transistors and metal oxide transistors. An active layer of a low-temperature poly silicon transistor may be made of Low Temperature Poly Silicon (LTPS for short), and an active layer of a metal oxide transistor may be made of a metal oxide semiconductor (Oxide). A low-temperature poly silicon transistor has advantages such as a high migration rate and fast charging, and an oxide transistor has advantages such as low drain current. The low-temperature poly silicon transistor and the metal oxide transistor are integrated on one display substrate to form a Low Temperature Polycrystalline Oxide (LTPO for short) display substrate, so that advantages of the low-temperature poly silicon transistor and the metal oxide transistor may be utilized, low-frequency drive may be achieved, power consumption may be reduced, and display quality may be improved.

Figure 6:
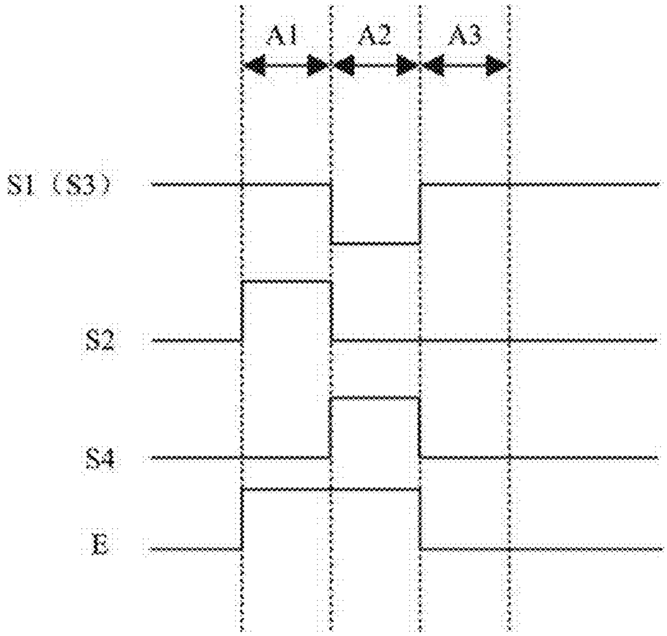
FIG. 6 is a working timing diagram of a pixel drive circuit.

FIG. 6 is a working timing diagram of a pixel drive circuit. An exemplary embodiment of the present disclosure will be described below through a working process of the pixel drive circuit exemplified in FIG. 5. The pixel drive circuit in FIG. 5 includes seven transistors (a first transistor T1 to a seventh transistor T7) and one storage capacitor C, wherein the first transistor T1 and the second transistor T2 are N-type oxide transistors, and the third transistor T3 to the seven transistor T7 are P-type low-temperature poly silicon transistors. In an exemplary implementation mode, the working process of the pixel drive circuit may include following stages.

In a first stage A1, which is referred to as a reset stage, a signal of the second scan signal line S2 is a turned-on signal (high-level), and signals of the first scan signal line S1, the third scan signal line S3, the fourth scan signal line S4, and the light emitting signal line E are turned-off signals. The turned-on signal of the second scan signal line S2 enables the first transistor T1 to be turned on, and a signal of the first initial signal line INIT1 is provided to the second node N2 through the first transistor T1 to initialize(reset) the storage capacitor C, thereby clearing an original charge in the storage capacitor. The turned-off signals of the first scan signal line S1, the third scan signal line S3, the fourth scan signal line S4, and the light emitting signal line E enable the second transistor T2, the fourth transistor T4, the fifth transistor T5, the sixth transistor T6, and the seventh transistor T7 to be turned off, and an OLED does not emit light in this stage.

In a second stage A2, referred to as a data writing stage or a threshold compensation stage, signals of the first scan signal line S1, the third scan signal line S3, and the fourth scan signal line S4 are turned-on signals, signals of the second scan signal line S2 and the light emitting signal line E are turned-off signals, and the data signal line D outputs a data voltage. In this stage, the second end of the storage capacitor C is at a low level, so the third transistor T3 is turned on. The turned-on signals of the first scan signal terminal S1, the third scan signal terminal S3, and the fourth scan signal terminal S4 enable the second transistor T2, the fourth transistor T4, and the seventh transistor T7 to be turned on. The second transistor T2 and the fourth transistor T4 are turned on, so that the data voltage output by the data signal line D is provided to the second node N2 through the first node N1, the turned-on third transistor T3, the third node N3, and the turned-on second transistor T2, and the storage capacitor C is charged with a difference between the data voltage output by the data signal line D and a threshold voltage of the third transistor T3. A voltage at the second end (the second node N2) of the storage capacitor C is $Vd-|Vth|$, wherein Vd is the data voltage output by the data signal line D, and Vth is the threshold voltage of the third transistor T3. The seventh transistor T7 is turned on, so that a signal of the second initial signal line INIT2 is provided to a first electrode of the OLED to initialize (reset) the first electrode of the OLED and clear its internal pre-stored voltage, thereby completing initialization and ensuring that the OLED does not emit light. A turned-off signal of the second scan signal line S2 enables the first transistor T1 to be turned off, and a turned-off signal of the light emitting signal line E enables the fifth transistor T5 and the sixth transistor T6 to be turned off.

In a third stage A3, referred to as a light emitting stage, a signal of the light emitting signal line E is a turned-on signal, and signals of the first scan signal line S1, the second scan signal line S2, the third scan signal line S3, and the fourth scan signal line S4 are turned-off signals. The turned-on signal of the light emitting signal line E enables the fifth transistor T5 and the sixth transistor T6 to be turned on, and a power voltage output by the first power supply line VDD provides a drive voltage to the first electrode of the OLED through the turned-on fifth transistor T5, the third transistor T3, and the sixth transistor T6 to drive the OLED to emit light.

In a drive process of the pixel drive circuit, a drive current flowing through the third transistor T3 (drive transistor) is determined by a voltage difference between a gate electrode and a first electrode of the third transistor T3. The voltage of the second node N2 is Vdata−|Vth|, so the drive current of the third transistor T3 is as follows.

$$I = K*(Vgs - Vth)^2 = K*[(Vdd - Vd + |Vth|) - Vth]^2 = K*[(Vdd - Vd]^2$$

Herein, I is the drive current flowing through the third transistor T3, i.e., a drive current for driving the OLED, K is a constant, Vgs is the voltage difference between the gate electrode and the first electrode of the third transistor T3, Vth is the threshold voltage of the third transistor T3, Vd is the data voltage output by the data signal line D, and Vdd is the power voltage output by the first power supply line VDD.

With development of OLED display technologies, consumers have higher requirements for a display effect of a display product. An extremely narrow border has become a new trend in development of display products. Therefore, border narrowing or even a borderless design has attracted more and more attention in a design of an OLED display product. At present, a left border, a right border, and an up border of a display apparatus may be controlled within 1.0 mm.

However, a narrowing design of a down border (a border on a side of the bonding region) is more difficult to implement, and it is always maintained at about 2.0 mm. In order to reduce a width of the down border, a solution of reducing a length of a fan-out region or a bending region is mainly adopted for some display substrates, but under an existing process capacity, the down border is still much larger than the left border and the right border.

An exemplary embodiment of the present disclosure provides a display substrate. In an exemplary implementation mode, the display substrate may include a display region and a bonding region located on a side of the display region, wherein the display region includes M pixel rows arranged sequentially, and M is a positive integer greater than 1; at least one pixel row includes a scan signal line and a plurality of sub-pixels arranged sequentially along an extension direction of the scan signal line, wherein at least one sub-pixel includes a pixel drive circuit connected with the scan signal line, the pixel drive circuit at least includes a storage capacitor and a plurality of transistors, the plurality of transistors at least include a first transistor as a first initialization transistor, and the scan signal line at least includes a second scan signal line configured to control the first transistor to be turned on or off, and in at least one pixel row, the second scan signal line is arranged on a side of the storage capacitor close to a display region boundary, and the display region boundary is an edge of the display region close to the bonding region.

In an exemplary implementation mode, a first electrode of the first transistor is connected with a first initial signal line, and the first initial signal line is arranged on a side of the storage capacitor close to the display region boundary.

In an exemplary implementation mode, an edge of the first initial signal line close to a side of the bonding region in an M-th pixel row forms a pixel drive circuit boundary.

In an exemplary implementation mode, the pixel drive circuit boundary is located on a side of the display region boundary away from the bonding region.

In an exemplary implementation mode, a distance between the pixel drive circuit boundary and the display region boundary is 6 μm to 10 μm.

Figure 7:
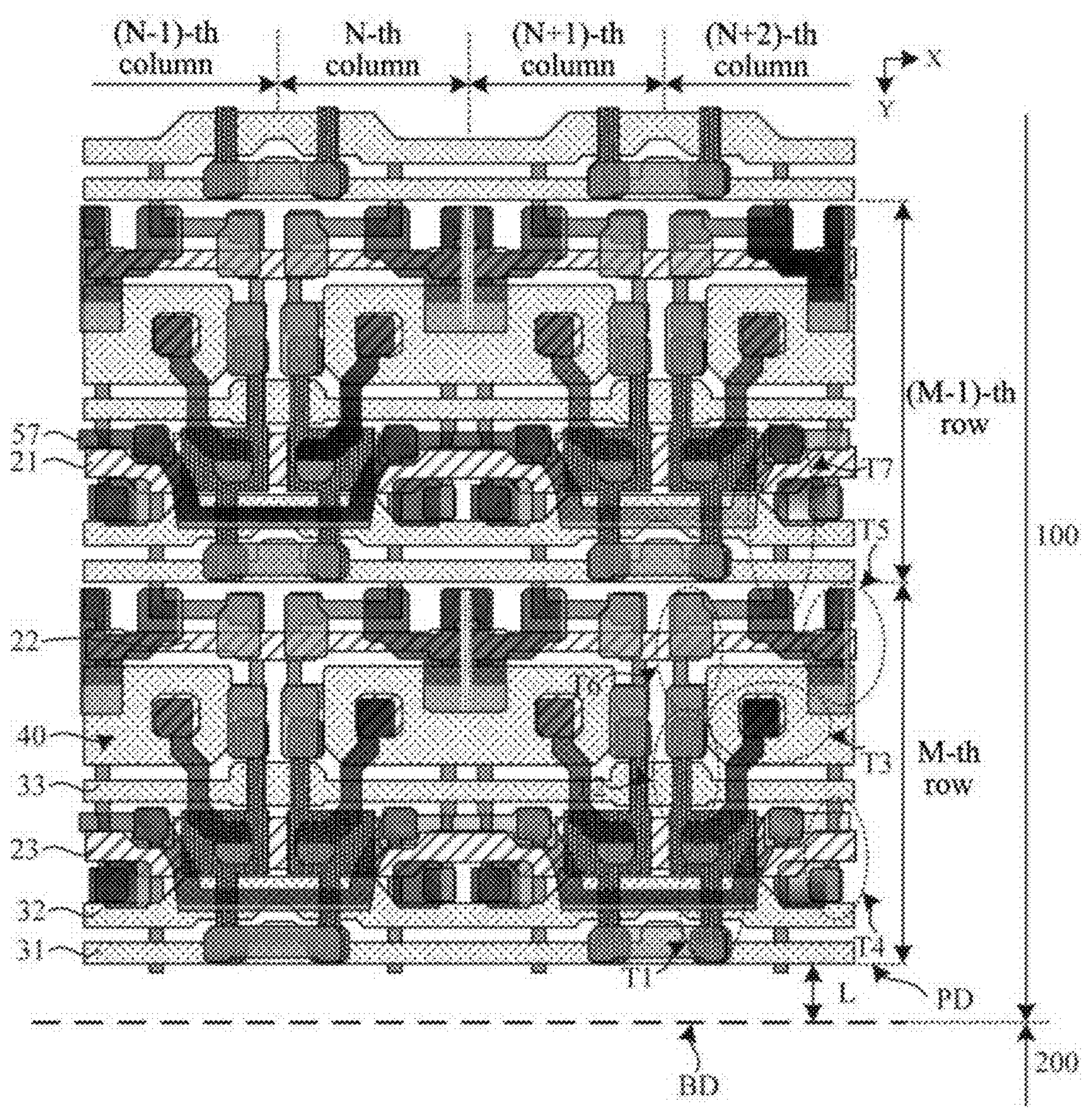
FIG. 7 is a schematic diagram of a planar structure of a display substrate according to an exemplary embodiment of the present disclosure.

FIG. 7 is a schematic diagram of a planar structure of a display substrate of an exemplary embodiment of the present disclosure, and is a structure of pixel drive circuits of an (M−1)-th pixel row and an M-th pixel row close to a bonding region in a display region. In an exemplary implementation mode, the display substrate may include a display region 100 and a bonding region 200 located on a side of the display region 100 in a second direction Y, wherein the display region 100 may include M pixel rows arranged sequentially along the second direction Y, at least one pixel row may include a plurality of sub-pixels arranged sequentially along a first direction X, and M is a positive integer greater than 1. As shown in FIG. 7, the M-th row is a pixel row closest to a display region boundary BD, the (M−1)-th row is a pixel row located on a side of the M-th row away from the display region boundary BD, and the display region boundary BD is an edge of the display region 100 close to the bonding region 200.

In an exemplary implementation mode, for a plurality of anodes arranged in the display region, each anode has an edge close to a side of the bonding region, an edge of the plurality of anodes closest to the bonding region is referred to as an anode boundary, and the display region boundary BD may be a straight line passing through the anode boundary and extending along the first direction X.

In an exemplary implementation mode, the display region boundary may be located within the display region or may be located in the bonding region, and the display region boundary may be a related structural reference line with structural characteristics. For example, the display region boundary may be a position of an isolation dam boundary in the bonding region. For another example, the display region boundary may be a position where a cathode ends in the bonding region. For yet another example, the display region boundary may be a position of a straight edge region of a fan-out trace in the bonding region. For yet another example, the display region boundary may be a position of transfer and switch-in (transfer via) of a data signal line in the bonding region, which is not limited here in the present disclosure.

In an exemplary implementation mode, at least one pixel row may include a scan signal line extending along the first direction X, and at least one sub-pixel in one pixel row may include a pixel drive circuit connected with the scan signal line.

In an exemplary implementation mode, the pixel drive circuit may at least include a plurality of transistors and a storage capacitor. The plurality of transistors in the pixel drive circuit may at least include a first transistor T1 as a first initialization transistor, and the scan signal line may at least include a second scan signal line 32 configured to control the first transistor T1 to be turned on or off.

In an exemplary implementation mode, a storage capacitor 40 may be located in a middle region of a sub-pixel in the second direction Y, and may include a first electrode plate and a second electrode plate which are stacked.

In an exemplary implementation mode, the second scan signal line 32 may be arranged on a side of the storage capacitor 40 close to the display region boundary BD in at least one pixel row.

In an exemplary implementation mode, the first transistor T1 may include a gate electrode, a first electrode, and a second electrode, wherein the gate electrode of the first transistor T1 may be connected with the second scan signal line 32, and the first electrode of the first transistor T1 may be connected with a first initial signal line 31, and the first initial signal line 31 may be arranged on a side of the storage capacitor 40 close to the display region boundary BD.

In an exemplary implementation mode, an edge of the first initial signal line 31 in the M-th pixel row close to a side of the bonding region 200 forms a pixel drive circuit boundary PD, and the pixel drive circuit boundary PD may be located on a side of the display region boundary BD away from the bonding region 200.

In an exemplary implementation mode, a distance L between the pixel drive circuit boundary PD and the display region boundary BD may be about 6 μm to 10 μm.

In an exemplary implementation mode, the plurality of transistors in the pixel drive circuit may further include a seventh transistor T7 as a second initialization transistor, and the scan signal line may further include a first scan signal line 21, wherein the first scan signal line 21 is configured to control the seventh transistor T7 to be turned on or off, and is arranged on a side of the storage capacitor 40 away from the display region boundary BD.

In an exemplary implementation mode, the seventh transistor T7 may include a gate electrode, a first electrode, and a second electrode, wherein the gate electrode of the seventh transistor T7 may be connected with the first scan signal line 21, and the first electrode of the seventh transistor T7 may be connected with a second initial signal line 57, and the second initial signal line 57 may be arranged on a side of the storage capacitor 40 away from the display region boundary BD.

In an exemplary implementation mode, an orthographic projection of the second initial signal line 57 in an i-th pixel row on the display substrate is at least partially overlapped with an orthographic projection of the second scan signal line 32 in an (i−1)-th pixel row on the display substrate, and i=2, 3, . . . , M.

In an exemplary implementation mode, the plurality of transistors in the pixel drive circuit may further include a second transistor T2 as a compensation transistor and a fourth transistor T4 as a data writing transistor, and the scan signal line may also include a third scan signal line 23 and a fourth scan signal line 33, wherein the third scan signal line 23 is configured to control the fourth transistor T4 to be turned on or off, the fourth scan signal line 33 is configured to control the second transistor T2 to be turned on or off, and the third scan signal line 23 and the fourth scan signal line 33 are arranged on a side of the storage capacitor 40 close to the display region boundary BD.

In an exemplary implementation mode, the third scan signal line 23 may be arranged on a side of the fourth scan signal line 33 close to the display region boundary BD.

In an exemplary implementation mode, the first scan signal line 21 in the i-th pixel row and the third scan signal line 23 in the (i−1)-th pixel row may be of an integral structure.

In an exemplary implementation mode, the plurality of transistors in the pixel drive circuit further includes a fifth transistor T5 and a sixth transistor T6 as light emitting transistors, and the display substrate may also include a light emitting control line 22, wherein the light emitting control line 22 is configured to control the fifth transistor T5 and the sixth transistor T6 to be turned on or off, and is arranged on a side of the storage capacitor 40 away from the display region boundary BD.

In an exemplary implementation mode, the plurality of transistors in the pixel drive circuit may include a first transistor T1 as a first initialization transistor, a second transistor T2 as a compensation transistor, a third transistor T3 as a drive transistor, a fourth transistor T4 as a data writing transistor, a fifth transistor T5 and a sixth transistor T6 as light emitting transistors, and a seventh transistor T7 as a second initialization transistor.

In an exemplary implementation mode, the fourth transistor T4 may be arranged on a side of the third transistor T3 close to the display region boundary BD, and the fifth transistor T5, the sixth transistor T6, and the seventh transistor T7 may be arranged on a side of the third transistor T3 away from the display region boundary BD.

In an exemplary implementation mode, the first transistor T1 and the second transistor T2 may be oxide transistors, and the third transistor T3 to the seventh transistor T7 may be low-temperature poly silicon transistors.

In an exemplary implementation mode, in a plane perpendicular to the display substrate, the display substrate may include a drive circuit layer arranged on a base substrate and a light emitting structure layer arranged on a side of the drive circuit layer away from the base substrate. The drive circuit layer may include a first semiconductor layer, a first conductive layer, a second conductive layer, a second semiconductor layer, and a third conductive layer arranged along a direction away from the base substrate. The first semiconductor layer may at least include active layers of a plurality of poly silicon transistors, and the first conductive layer may at least include a first scan signal line 21, a third scan signal line 23, gate electrodes of the plurality of poly silicon transistors, and a first electrode plate of a storage capacitor 40. The second conductive layer may at least include a second scan signal line 32, a fourth scan signal line 33, a first initial signal line 31, gate electrodes of a plurality of oxide transistors and a second electrode plate of the storage capacitor 40, and the second semiconductor layer may at least include active layers of the plurality of oxide transistors. The third conductive layer may at least include a second initial signal line 57.

In the present disclosure, "A extends along a B direction" means that A may include a main portion and a secondary portion connected with the main portion, the main portion is a line, a line segment, or a strip-shaped body, the main portion extends along the B direction, and a length of the main portion extending along the B direction is greater than a length of the secondary portion extending along another direction. In following description, "A extends along the B direction" means "a main body portion of A extends along the B direction". In an exemplary implementation mode, the second direction Y may be a direction pointing to the bonding region from the display region, and an opposite direction of the second direction Y may be a direction pointing to the display region from the bonding region.

Exemplary description is made below through a preparation process of a display substrate. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and inkjet printing. Etching may be any one or more of dry etching and wet etching, which is not limited in present disclosure. A "thin film" refers to a layer of thin film made of a material on a base substrate through a process such as deposition and coating. If the "thin film" does not need a patterning process in an entire manufacturing process, the "thin film" may also be called a "layer". If the "thin film" needs a patterning process in an entire manufacturing process, it is called a "thin film" before the patterning process, and called a "layer" after the patterning process. The "layer" after the patterning process includes at least one "pattern". "A and B being arranged in a same layer" mentioned in the present disclosure means that A and B are formed simultaneously through a same patterning process, and a "thickness" of a film layer is a dimension of the film layer in a direction perpendicular to a display substrate. In an exemplary implementation mode of the present disclosure, "an orthographic projection of B is within a range of an orthographic projection of A" or "an orthographic projection of A contains an orthographic projection of B" refers to that a boundary of the orthographic projection of B falls within a range of a boundary of the orthographic projection of A, or the boundary of the orthographic projection of A is overlapped with the boundary of the orthographic projection of B.

In an exemplary implementation mode, taking 8 sub-pixels in the (M−1)-th pixel row and the M-th pixel row close to the display region boundary BD as an example, the preparation process of the display substrate may include following operations.

(1) A base substrate is prepared on a glass carrier plate. In an exemplary implementation mode, the base substrate may be a flexible base substrate, or may be a rigid base substrate. The rigid base substrate may include, but is not limited to, one or more of glass and quartz. The flexible base substrate may be made of, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers. In an exemplary implementation mode, the flexible base substrate may include a first flexible material layer, a first inorganic material layer, a semiconductor layer, a second flexible material layer, and a second inorganic material layer stacked on the glass carrier plate. Materials of the first flexible material layer and the second flexible material layer may be Polyimide (PI), Polyethylene Terephthalate (PET), or a polymer soft film subjected to a surface treatment, etc. Materials of the first inorganic material layer and the second inorganic material layer may be Silicon Nitride (SiNx), Silicon Oxide (SiOx), or the like, so as to improve a water-oxygen resistance capability of the base substrate. The first inorganic material layer and the second inorganic material layer are also referred to as barrier layers. A material of the semiconductor layer may be amorphous silicon (a-si). In an exemplary implementation mode, taking a laminated structure of PI1/Barrier1/a-si/PI2/Barrier2 as an example, its preparation process may include: firstly, coating a layer of polyimide on the glass carrier plate, curing it into a film to form a first flexible (PI1) layer; then, depositing a layer of barrier thin film on the first flexible layer to form a first barrier (Barrier1) layer covering the first flexible layer; then depositing a layer of amorphous silicon thin film on the first barrier layer to form an amorphous silicon (a-si) layer covering the first barrier layer; then coating a layer of polyimide on the amorphous silicon layer, curing it into a film to form a second flexible (PI2) layer; then depositing a layer of barrier thin film on the second flexible layer to form a second barrier (Barrier2) layer covering the second flexible layer, thereby completing preparation of the base substrate.

Figure 8:
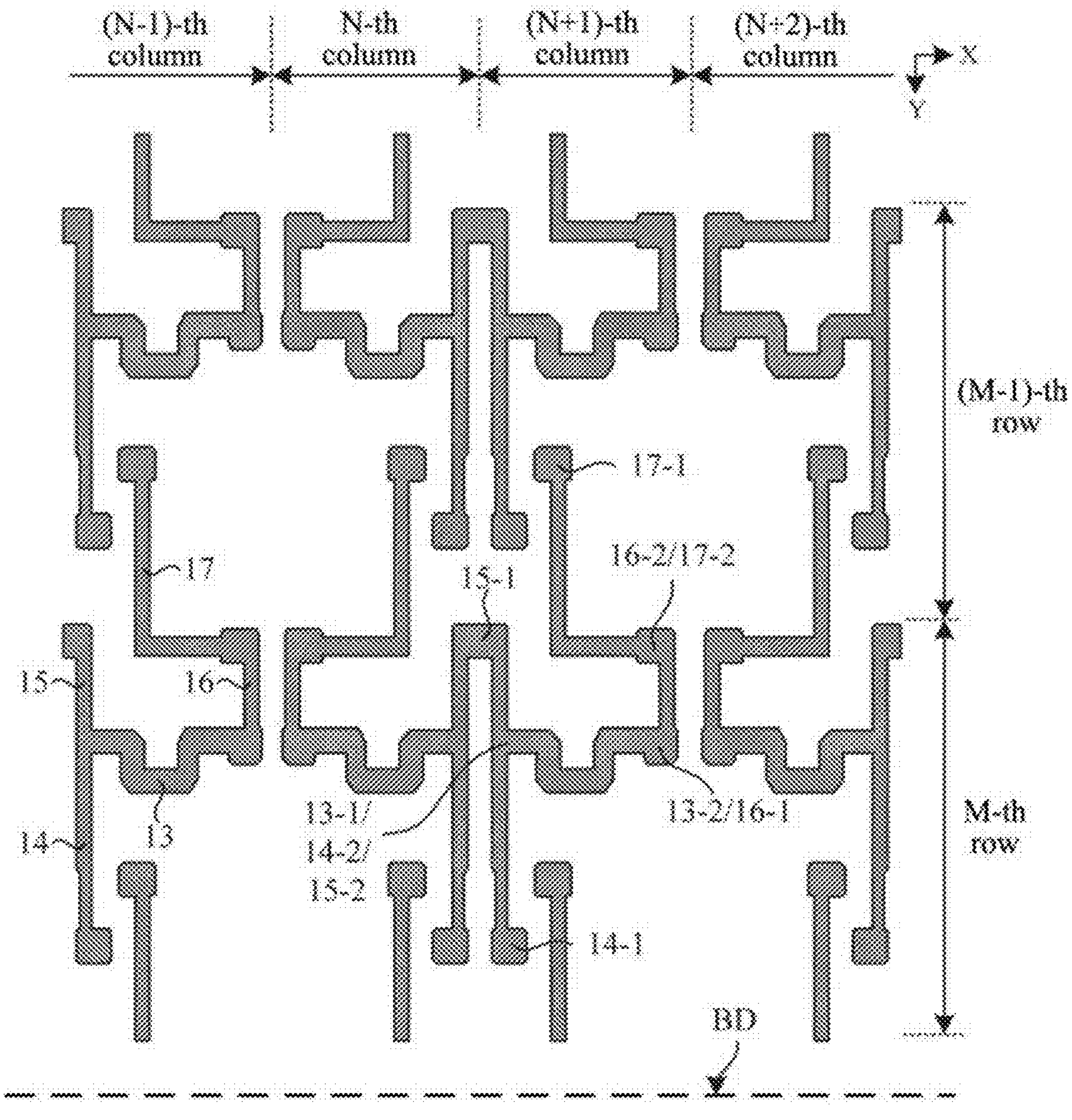
FIG. 8 is a schematic diagram after a pattern of a first semiconductor layer is formed according to an embodiment of the present disclosure.

(2) A pattern of a first semiconductor layer is formed. In an exemplary implementation mode, forming a pattern of a first semiconductor layer may include: depositing sequentially a first insulation thin film and a first semiconductor thin film on the base substrate, and patterning the first semiconductor thin film through a patterning process to form a first insulation layer covering the base substrate and the pattern of the first semiconductor layer arranged on the first insulation layer, as shown in FIG. 8.

In an exemplary implementation mode, the pattern of the first semiconductor layer of each sub-pixel may at least include a third active layer 13 of the third transistor T3 to a seventh active layer 17 of the seventh transistor T7, and the third active layer 13 to the seventh active layer 17 are of an integral structure connected with one another.

In an exemplary implementation mode, in the first direction X, the sixth active layer 16 may be located on one side of the third active layer 13 in the present sub-pixel, and the fourth active layer 14 and the fifth active layer 15 may be located on the other side of the third active layer 13 in the present sub-pixel. In the second direction Y, the fourth active layer 14 in sub-pixels of an i-th row may be located on a side of the third active layer 13 in the present sub-pixel in the second direction Y (i.e., on a side close to the display region boundary BD), and the fifth active layer 15, the sixth active layer 16, and the seventh active layer 17 in the sub-pixels of the i-th row may be located on a side of the third active layer 13 in the present sub-pixel in an opposite direction of the second direction Y (i.e., on a side away from the display region boundary BD), and i=2, 3, . . . , M.

In an exemplary implementation mode, the third active layer 13 may be in a shape of an inverted "Q", and the fourth active layer 14 to the seventh active layer 17 may be in a shape of an "I".

In an exemplary implementation mode, an active layer of each transistor may include a first region, a second region, and a channel region located between the first region and the second region. In an exemplary implementation mode, a first region 13-1 of the third active layer 13 may simultaneously serve as a second region 14-2 of the fourth active layer 14 and a second region 15-2 of the fifth active layer 15, a second region 13-2 of the third active layer 13 may simultaneously serve as a first region 16-1 of the sixth active layer 16, a second region 16-2 of the sixth active layer 16 may simultaneously serve as a second region 17-2 of the seventh active layer 17, and a first region 14-1 of the fourth active layer 14, a first region 15-1 of the fifth active layer 15, and a first region 17-1 of the seventh active layer 17 may be individually arranged.

In an exemplary implementation mode, the first region 17-1 of the seventh active layer 17 in the sub-pixels of the i-th row may be arranged in sub-pixels of an (i−1)-th row, and i=2 3 . . . M.

In an exemplary implementation mode, in one pixel row, first regions 15-1 of fifth active layers 15 in two adjacent sub-pixels may be connected with each other. For example, a first region 15-1 of a fifth active layer 15 of an (N−2)-th column and a first region 15-1 of a fifth active layer 15 of an (N−1)-th column are connected with each other, a first region 15-1 of a fifth active layer 15 of an N-th column and a first region 15-1 of a fifth active layer 15 of an (N+1)-th column are connected with each other, and a first region 15-1 of a fifth active layer 15 of an (N+2)-th column and a first region 15-1 of a fifth active layer 15 of an (N+3)-th column are connected with each other. In an exemplary implementation mode, since a first region of a fifth active layer in each sub-pixel is configured to be connected with a first power supply line formed subsequently, by forming first regions of fifth active layers of adjacent sub-pixels into an interconnected integral structure, first electrodes of fifth transistors in the adjacent sub-pixels may be ensured to have a same potential, which is beneficial to improving uniformity of a panel and avoiding poor display of the display substrate, thereby ensuring a display effect of the display substrate.

In an exemplary implementation mode, the first semiconductor layer may be made of poly Silicon (p-Si), that is, the first transistor to the sixth transistor are LTPS thin film transistors. In an exemplary implementation mode, the patterning the first semiconductor thin film through the patterning process may include: forming an amorphous silicon (a-si) thin film on the first insulation thin film, dehydrogenating the amorphous silicon thin film, and crystallizing the dehydrogenated amorphous silicon thin film to form a poly silicon thin film. Subsequently, the poly silicon thin film is patterned to form the pattern of the first semiconductor layer.

Figures 9A, 9B:
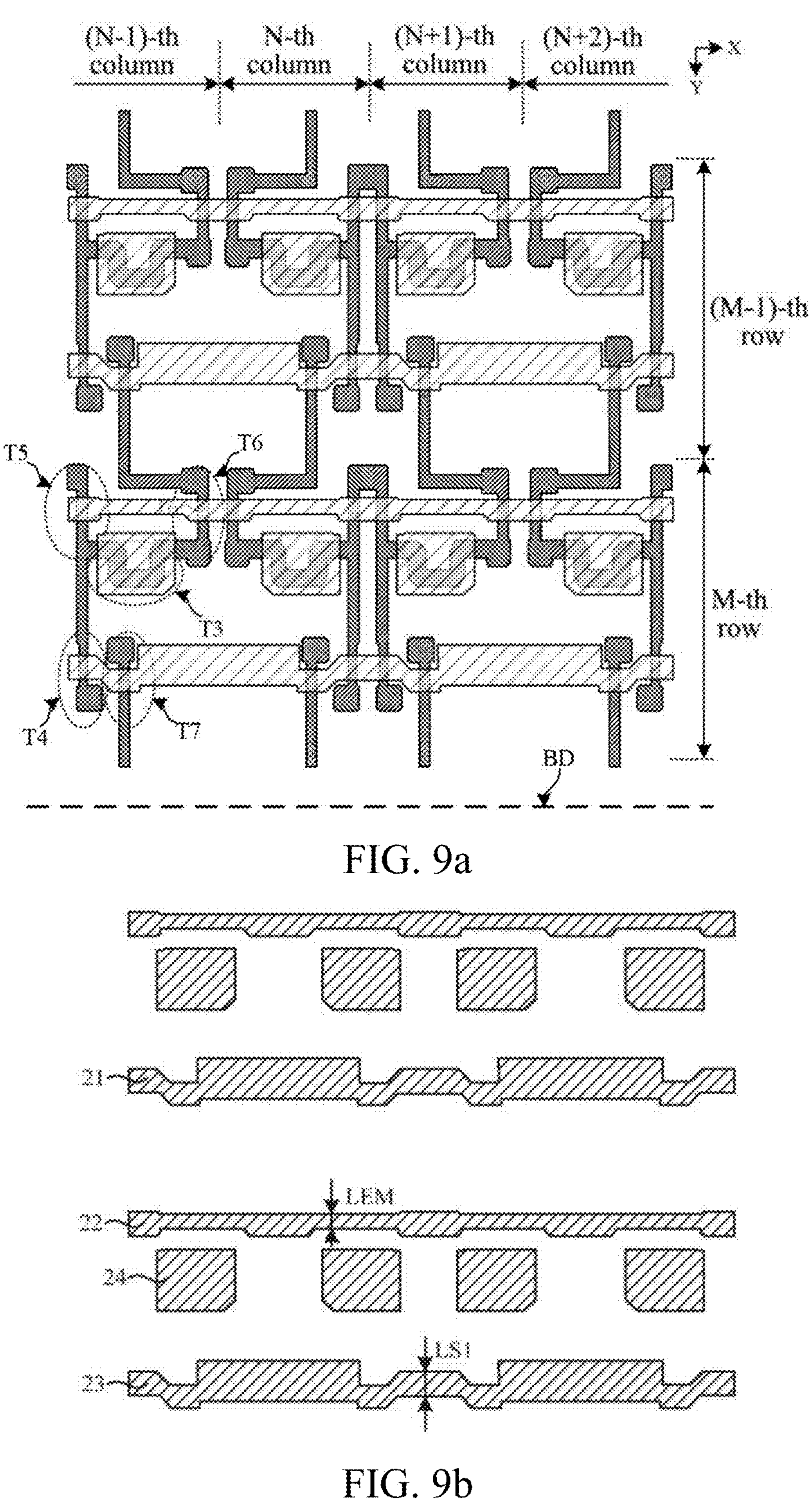
FIG. 9*a* and FIG. 9*b* are schematic diagrams after a pattern of a first conductive layer is formed according to an embodiment of the present disclosure.

(3) A pattern of a first conductive layer is formed. In an exemplary implementation mode, forming a pattern of a first conductive layer may include: sequentially depositing a second insulation thin film and a first conductive thin film on the base substrate on which the above-mentioned patterns are formed, and patterning the first conductive thin film through a patterning process to form a second insulation layer that covers the pattern of the first semiconductor layer and the pattern of the first conductive layer arranged on the second insulation layer, as shown in FIG. 9*a* and FIG. 9*b*, and FIG. 9*b* is a planar schematic diagram of the first conductive layer in FIG. 9*a*. In an exemplary implementation mode, the first conductive layer may be referred to as a first gate metal (GATE1) layer.

In an exemplary implementation mode, the pattern of the first conductive layer of each sub-pixel at least includes a first scan signal line 21, a light emitting control line 22, a third scan signal line 23, and a first electrode plate 24 of a storage capacitor.

In an exemplary implementation mode, the first electrode plate 24 may be in a shape of a rectangle, and a chamfer may be provided at a corner of the rectangle. An orthographic projection of the first electrode plate 24 on the base substrate is at least partially overlapped with an orthographic projection of the third active layer of the third transistor T3 on the base substrate. In an exemplary implementation mode, the first electrode plate 24 may serve as an electrode plate of the storage capacitor and a gate electrode of the third transistor T3 simultaneously.

In an exemplary implementation mode, the second scan signal line 21 may be of a polygonal line shape of which a main body portion extends along the first direction X, the first scan signal line 21 in the sub-pixels of the i-th row may be located on a side of the first electrode plate 24 of the present sub-pixel in an opposite direction of the second direction Y (i.e., on a side away from the display region boundary BD), and a region where first scan signal line 21 is overlapped with the seventh active layer of the present sub-pixel serves as a gate electrode of the seventh transistor T7.

In an exemplary implementation mode, the first scan signal line 21 in the sub-pixels of the i-th row may be arranged in the sub-pixels of the (i−1)-th row.

In an exemplary implementation mode, the light emitting control line 22 may be of a line shape of which a main body portion extends along the first direction X, the light emitting control line 22 in the sub-pixels of the i-th row may be located on a side of the first electrode plate 24 in the opposite direction of the second direction Y (i.e., on a side away from the display region boundary BD) and is located between the first electrode plate 24 and the first scan signal line 21, a region where the light emitting control line 22 is overlapped with the fifth active layer of the present sub-pixel serves as a gate electrode of the fifth transistor T5, and a region where the light emitting control line 22 is overlapped with the sixth active layer of the present sub-pixel serves as a gate electrode of the sixth transistor T6.

In an exemplary implementation mode, the third scan signal line 23 may be of a polygonal line shape of which a main body portion extends along the first direction X, the third scan signal line 23 in the sub-pixels of the i-th row may be located on a side of the first electrode plate 24 of the present sub-pixel in the second direction Y (i.e., on a side close to the display region boundary BD), and a region where the third scan signal line 23 is overlapped with the fourth active layer of the present sub-pixel serves as a gate electrode of the fourth transistor T4.

In the exemplary implementation mode, the third scan signal line 23 in the sub-pixels of the (i−1)-th row may be used as the first scan signal line 21 in the sub-pixels of the i-th row, that is, the third scan signal line 23 in the (i−1)-th row and the first scan signal line 21 in the i-th row are of an integral structure.

In an exemplary implementation mode, widths of the first scan signal line 21, the light emitting control line 22, and the third scan signal line 23 may be designed to be unequal, and the widths of the first scan signal line 21, the light emitting control line 22, and the third scan signal line 23 are dimensions in the second direction Y, so that not only a layout of a pixel structure may be facilitated, but also a parasitic capacitance between signal lines may be reduced, which is not limited here in the present disclosure.

In an exemplary implementation mode, the first scan signal line 21 and the third scan signal line 23 may include a region overlapping with the first semiconductor layer and a region not overlapping with the first semiconductor layer, wherein widths of the first scan signal line 21 and the third scan signal line 23 in the region overlapping with the first semiconductor layer may be smaller than widths of the first scan signal line 21 and the third scan signal line 23 in the region not overlapping with the first semiconductor layer. In an exemplary implementation mode, a width LS1 of the first scan signal line 21 and the third scan signal line 23 in the region overlapping with the first semiconductor layer may be about 3.6 μm to 4.0 μm. For example, the width LS1 may be about 3.8 μm.

In an exemplary implementation mode, the light emitting control line 22 may include a region overlapping with the first semiconductor layer and a region not overlapping with the first semiconductor layer, wherein a width of the first scan signal line 21 in the region overlapping with the first semiconductor layer may be greater than a width of the first scan signal line 21 in the region not overlapping with the first semiconductor layer. In an exemplary implementation mode, a width LEM of the first scan signal line 21 in the region not overlapping with the first semiconductor layer may be about 1.8 μm to 2.2 μm. For example, the width LEM may be about 2.0 μm.

In an exemplary implementation mode, after the pattern of the first conductive layer is formed, the first semiconductor layer may be subjected to a conductive treatment by using the first conductive layer as a shield. The first semiconductor layer in a region shielded by the first conductive layer, forms channel regions of the third transistor T3 to the seventh transistor T7, and the first semiconductor layer in a region not shielded by the first conductive layer, is made to be conductive, that is, first regions and second regions of the third transistor T3 to the seventh active layer are all made to be conductive.

Figure 10A:
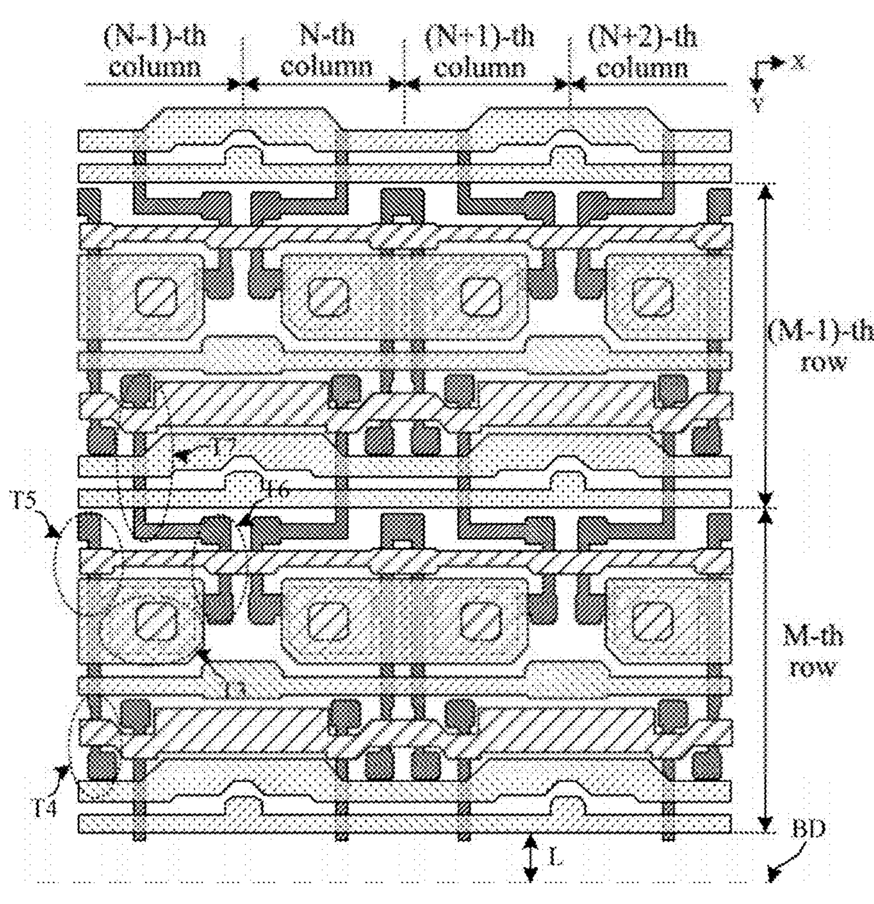
FIG. 10*a* and FIG. 10*b* are schematic diagrams after a pattern of a second conductive layer is formed according to an embodiment of the present disclosure.
Figure 10B:
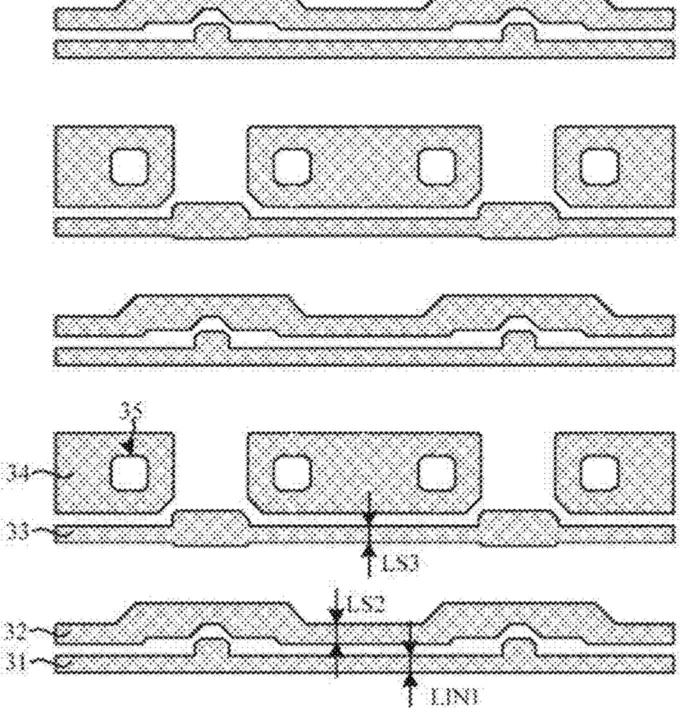

(4) A pattern of a second conductive layer is formed. In an exemplary implementation mode, forming a pattern of a second conductive layer may include: sequentially depositing a third insulation thin film and a second conductive thin film on the base substrate on which the above-mentioned patterns are formed, and patterning the second conductive thin film through a patterning process to form a third insulation layer that covers the first semiconductor layer and the pattern of the second conductive layer arranged on the third insulation layer, as shown in FIG. 10*a* and FIG. 10*b*, and FIG. 10*b* is a planar schematic diagram of the second conductive layer in FIG. 10*a*. In an exemplary implementation mode, the second conductive layer may be referred to as a second gate metal (GATE2) layer.

In an exemplary implementation mode, the pattern of the second conductive layer of each sub-pixel at least includes a first initial signal line 31, a second scan signal line 32, a fourth scan signal line 33, and a second electrode plate 34 of the storage capacitor.

In an exemplary implementation mode, a profile of second electrode plate 34 may be in a shape of a rectangle, a corner of the rectangle may be provided with a chamfer, an orthographic projection of the second electrode plate 34 on the base substrate is at least overlapped with an orthographic projection of the first electrode plate 24 on the base substrate, the second electrode plate 34 may serve as anther electrode plate of the storage capacitor, and the first electrode plate 24 and the second electrode plate 34 constitute the storage capacitor of the pixel drive circuit. The second electrode plate 34 is provided with an opening 35 which may be rectangular and may be located in a middle of the second electrode plate 34, so that the second electrode plate 34 forms an annular structure. The opening 35 exposes the third insulation layer covering the first electrode plate 24, and the orthographic projection of the first electrode plate 24 on the base substrate contains an orthographic projection of the opening 35 on the base substrate. In an exemplary implementation mode, the opening 35 is configured to accommodate a first via formed subsequently, and the first via is located in the opening 35 and exposes the first electrode plate 24, so that a second electrode of the first transistor T1 formed subsequently is connected with the first electrode plate 24.

In an exemplary implementation mode, second electrode plates 34 of two adjacent sub-pixels in one pixel row may be connected with each other. For example, a second electrode plate 34 of the (N−2)-th column and a second electrode plate 34 of the (N−1)-th column may be connected with each other through a first connection strip 34. For another example, a second electrode plate 34 of the N-th column and a second electrode plate 34 of the (N+1)-th column are connected with each other through a second connection strip 35. For yet another example, a second electrode plate 34 of the (N+2)-th column and a second electrode plate 34 of the (N+3)-th column are connected with each other through a second connection strip 35. In an exemplary implementation mode, since a second electrode plate 34 in each sub-pixel is connected with a first power supply line formed subsequently, by forming second electrode plates 34 of adjacent sub-pixels into an interconnected integral structure, the second electrode plates with the integral structure may be multiplexed into power supply signal lines, it may be ensured that a plurality of second electrode plates in one pixel row have a same potential, which is beneficial to improving uniformity of a panel and avoiding poor display of the display substrate, thereby ensuring a display effect of the display substrate.

In an exemplary implementation mode, the first initial signal line 31 may be of a straight line shape of which a main body portion extends along the first direction X, and the first initial signal line 31 in the sub-pixels of the i-th row may be located on a side of the second electrode plate 34 of the present sub-pixel in the second direction Y (i.e. on a side close to the display region boundary BD).

In an exemplary implementation mode, a width LIN1 of the first initial signal line 31 may be about 1.8 μm to 2.2 μm. For example, a width of the first initial signal line 31 may be about 2.0 μm.

In an exemplary implementation mode, the first initial signal line 31 of the M-th pixel row may form a pixel drive circuit boundary, and a distance L between the first initial signal line 31 and the display region boundary BD may be about 6 μm to 10 μm. For example, the distance L may be about 7.99 μm.

In an exemplary implementation mode, the second scan signal line 32 may be of a polygonal line shape of which a main body portion extends along the first direction X, the second scan signal line 32 in the sub-pixels of the i-th row may be located on a side of the second electrode plate 34 of the present sub-pixel in the second direction Y (i.e., on a side close to the display region boundary BD), and the second scan signal line 32 may be located between the first initial signal line 31 and the second electrode plate 34.

In an exemplary implementation mode, the second scan signal line 32 may be located between the first initial signal line 31 and the third scan signal line 23.

In an exemplary implementation mode, the fourth scan signal line 33 may be of a line shape of which a main body portion extends along the first direction X, the fourth scan signal line 33 in the sub-pixels of the i-th row may be located on a side of the second electrode plate 34 of the present sub-pixel in the second direction Y (i.e., on a side close to the display region boundary BD), and the fourth scan signal line 33 may be located between the second scan signal line 32 and the second electrode plate 34.

In an exemplary implementation mode, the fourth scan signal line 33 may be located between the third scan signal line 23 and the second electrode plate 34.

In an exemplary implementation mode, widths of the second scan signal line 32 and the fourth scan signal line 33 may be designed to be unequal, and widths of the second scan signal line 32 and the fourth scan signal line 33 are dimensions in the second direction Y, so that not only a layout of a pixel structure may be facilitated, but also a parasitic capacitance between signal lines may be reduced, which is not limited here in the present disclosure.

In an exemplary implementation mode, the second scan signal line 32 may include a region overlapping with the second semiconductor layer formed subsequently and a region not overlapping with the second semiconductor layer, and a width of the second scan signal line 32 in the region overlapping with the second semiconductor layer may be greater than a width of the second scan signal line 32 in the region not overlapping with the second semiconductor layer. In an exemplary implementation mode, a width LS2 of the second scan signal line 32 in the region not overlapping with the second semiconductor layer may be about 2.2 μm to 2.6 μm. For example, the width LS2 may be about 2.4 μm.

In an exemplary implementation mode, the fourth scan signal line 33 may include a region overlapping with the second semiconductor layer formed subsequently and a region not overlapping with the second semiconductor layer, and a width of the fourth scan signal line 33 in the region overlapping with the second semiconductor layer may be greater than a width of the fourth scan signal line 33 in the region not overlapping with the second semiconductor layer. In an exemplary implementation mode, a width LS3 of the fourth scan signal line 33 in the region not overlapping with the second semiconductor layer may be about 1.8 μm to 2.2 μm. For example, the width LS3 may be about 2.0 μm.

Figure 11A:
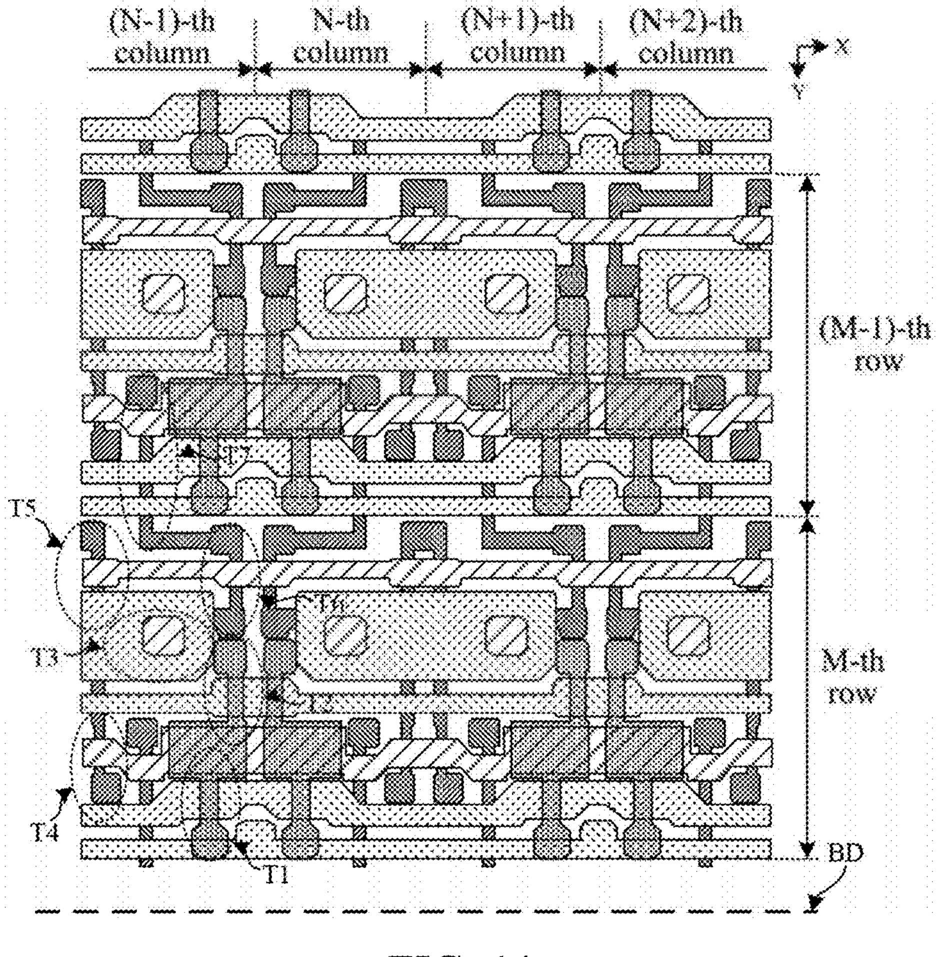
FIG. 11*a* and FIG. 11*b* are schematic diagrams after a pattern of a second semiconductor layer is formed according to an embodiment of the present disclosure.
Figure 11B:
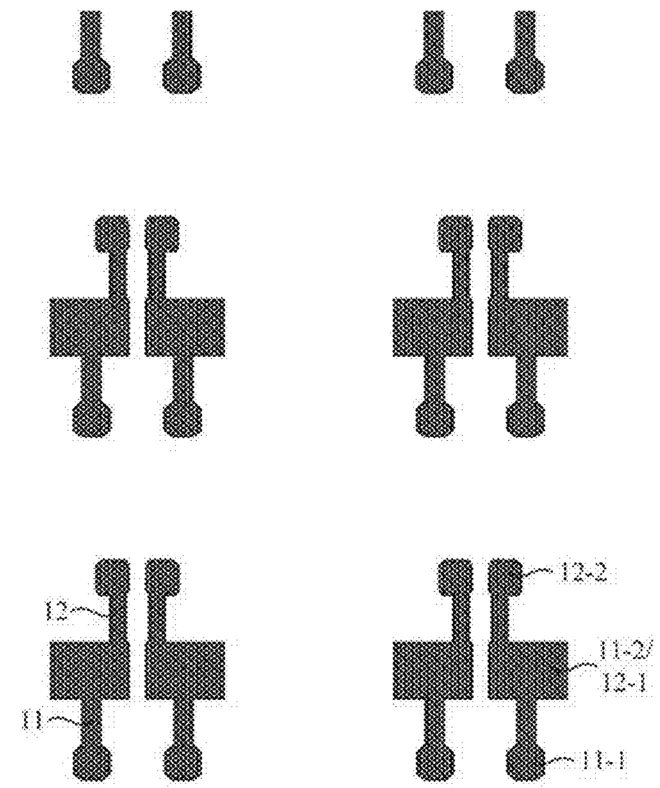

(5) A pattern of a second semiconductor layer is formed. In an exemplary implementation mode, forming a pattern of a second semiconductor layer may include: depositing a fourth insulation thin film and a second semiconductor thin film sequentially on the base substrate on which the above-mentioned patterns are formed, patterning the second semiconductor thin film through a patterning process to form a fourth insulation layer that covers the base substrate and the pattern of the second semiconductor layer arranged on the fourth insulation layer, as shown in FIG. 11*a* and FIG. 11*b*, and FIG. 11*b* is a planar schematic diagram of the second conductive layer in FIG. 11*a*.

In an exemplary implementation mode, the pattern of the second semiconductor layer of each sub-pixel at least includes a first active layer 11 of the first transistor T1 and a second active layer 12 of the second transistor T2.

In an exemplary implementation mode, a shape of the first active layer 11 may be an "I" shape, an orthographic projection of the first active layer 11 on the base substrate is at least partially overlapped with an orthographic projection of the second scan signal line 32 on the base substrate, and a region where the second scan signal line 32 is overlapped with the first active layer 11 of the present sub-pixel serves as a gate electrode of the first transistor T1.

In an exemplary implementation mode, a first region 11-1 of the first active layer 11 may be located on a side of the second scan signal line 32 in the second direction Y (i.e., on a side close to the display region boundary BD), and a second region 11-2 of the first active layer 11 may be located on a side of the second scan signal line 32 in an opposite direction of the second direction Y (i.e., on a side away from the display region boundary BD).

In an exemplary implementation mode, a shape of the second active layer 12 may be an "I" shape, an orthographic projection of the second active layer 12 on the base substrate is at least partially overlapped with an orthographic projection of the fourth scan signal line 33 on the base substrate, and a region where the fourth scan signal line 33 is overlapped with the second active layer 12 of the present sub-pixel serves as a gate electrode of the second transistor T2.

In an exemplary implementation mode, a first region 12-1 of the second active layer 12 may be located on a side of the fourth scan signal line 33 in the second direction Y (i.e., on a side close to the display region boundary BD), and a second region 12-2 of the second active layer 12 may be located on a side of the fourth scan signal line 33 in the opposite direction of the second direction Y (i.e., on a side away from the display region boundary BD).

In an exemplary implementation mode, a second region 11-2 of the first active layer 11 may serve as a first region 12-1 of the second active layer 12, that is, the second region 11-2 of the first active layer 11 and the first region 12-1 of the second active layer 12 are of an interconnected integral structure and may be located between the second scan signal line 32 and the fourth scan signal line 33.

In an exemplary implementation mode, an orthographic projection of the second region 11-2 of the first active layer 11 and the first region 12-1 of the second active layer 12 of the integral structure in the sub-pixels of the i-th row on the base substrate is at least partially overlapped with an orthographic projection of the third scan signal line 23 in the sub-pixels of the i-th row on the base substrate, and an orthographic projection of the second region 11-2 of the first active layer 11 and the first region 12-1 of the second active layer 12 of the integral structure in the sub-pixels of the (i−1)-th row on the base substrate is at least partially overlapped with an orthographic projection of the third scan signal line 23 (i.e. the first scan signal line 21 in the sub-pixels of the i-th row) in the sub-pixels of the (i−1)-th row on the base substrate.

In an exemplary implementation mode, the second semiconductor layer may be made of an oxide, that is, the first transistor T1 and the second transistor T2 are oxide transistors. In an exemplary implementation mode, the second semiconductor thin film may be made of Indium Gallium Zinc Oxide (IGZO), wherein electron mobility of the Indium Gallium Zinc Oxide (IGZO) is higher than that of amorphous silicon.

Figure 12:
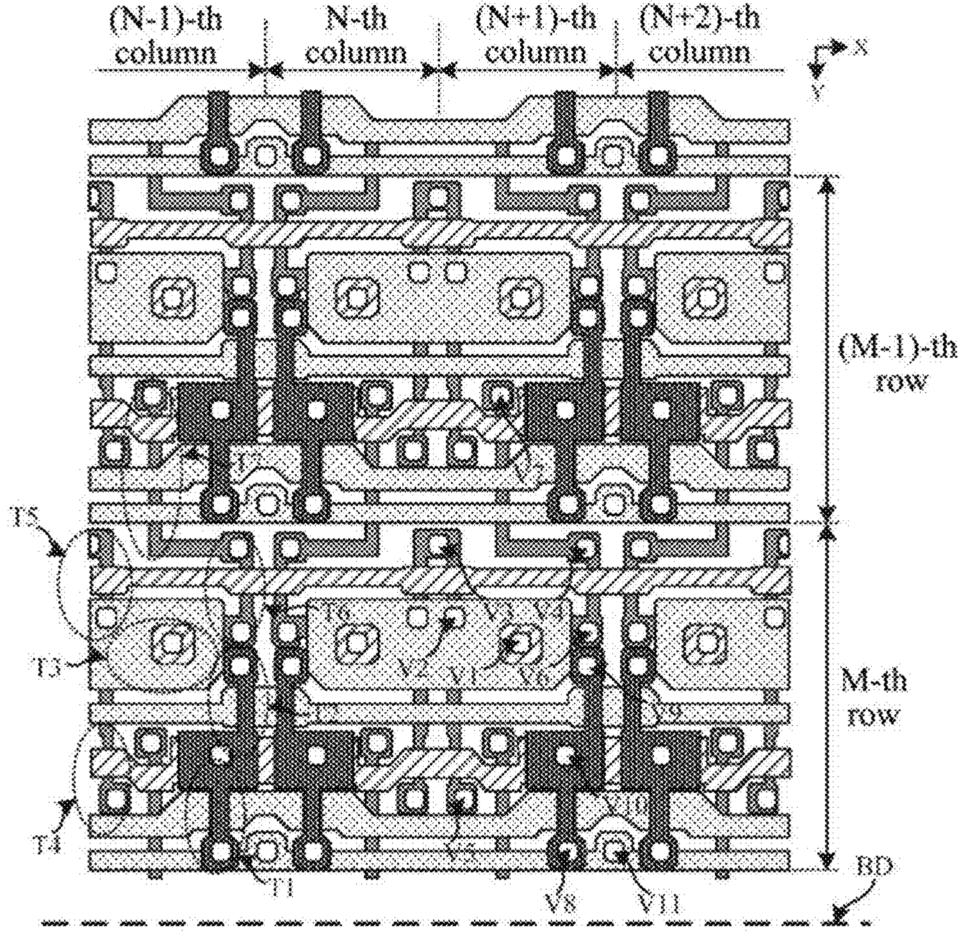
FIG. 12 is a schematic diagram after a pattern of a fifth insulation layer is formed according to an embodiment of the present disclosure.

(6) A pattern of a fifth insulation layer is formed. In an exemplary implementation mode, forming a pattern of a fifth insulation layer may include: depositing a fifth insulation thin film on the base substrate on which the aforementioned patterns are formed, and patterning the fifth insulation thin film through a patterning process to form a fifth insulation layer covering the second semiconductor layer, wherein a plurality of vias are provided on the fifth insulation layer, as shown in FIG. 12.

In an exemplary implementation mode, the plurality of vias of each sub-pixel at least include: a first via V1, a second via V2, a third via V3, a fourth via V4, a fifth via V5, a sixth via V6, a seventh via V7, an eighth via V8, a ninth via V9, a tenth via V10, and an eleventh via V11.

In an exemplary implementation mode, an orthographic projection of the first via V1 on the base substrate is located within a range of the orthographic projection of the opening 35 on the base substrate, and the fifth insulation layer, the fourth insulation layer, and the third insulation layer in the first via V1 are etched off to expose a surface of the first electrode plate 24. The first via V1 is configured such that the second electrode of the first transistor T1 formed subsequently is connected with the first electrode plate 24 through the via.

In an exemplary implementation mode, the second via V2 is located within a range of an orthographic projection of the second electrode plate 34 on the base substrate, and the fifth insulation layer and the fourth insulation layer in the second via V2 are etched away to expose a surface of the second electrode plate 34. The second via V2 is configured such that a first electrode of the fifth transistor T5 subsequently formed is connected with the second electrode plate 34 through the via.

In an exemplary implementation mode, an orthographic projection of the third via V3 on the base substrate is within a range of an orthographic projection of a first region of a fifth active layer on the base substrate, the fifth insulation layer, the fourth insulation layer, the third insulation layer, and the second insulation layer in the third via V3 are etched away to expose a surface of the first region of the fifth active layer, and the third via V3 is configured such that a first electrode of the fifth transistor T5 formed subsequently is connected with the first region of the fifth active layer through the via.

In an exemplary implementation mode, an orthographic projection of the fourth via V4 on the base substrate is within a range of an orthographic projection of a second region of a sixth active layer on the base substrate, the fifth insulation layer, the fourth insulation layer, the third insulation layer, and the second insulation layer in the fourth via V4 are etched away to expose a surface of the second region of the sixth active layer (also is a second region of a seventh active layer), and the fourth via V4 is configured such that the second electrode of the sixth transistor T6 (the second electrode of the seventh transistor T7) formed subsequently is connected with the second region of the sixth active layer through the via.

In an exemplary implementation mode, an orthographic projection of the fifth via V5 on the base substrate is located within a range of an orthographic projection of a first region of a fourth active layer on the base substrate, and the fifth insulation layer, the fourth insulation layer, the third insulation layer, and the second insulation layer in the fifth via V5 are etched away to expose a surface of the first region of the fourth active layer, and the fifth via V5 is configured such that a first electrode of the fourth transistor T4 formed subsequently is connected with the first region of the fourth active layer through the via.

In an exemplary implementation mode, an orthographic projection of the sixth via V6 on the base substrate is located within a range of an orthographic projection of a second region of a third active layer on the base substrate, the fifth insulation layer, the fourth insulation layer, the third insulation layer, and the second insulation layer in the sixth via V6 are etched away to expose a surface of the second region of the third active layer (also is a first region of a sixth active layer), and the sixth via V6 is configured such that the second electrode of the third transistor T3 (the first electrode of the sixth transistor T6) formed subsequently is connected with the second region of the third active layer through the via.

In an exemplary implementation mode, an orthographic projection of the seventh via V7 on the base substrate is within a range of an orthographic projection of a first region of a seventh active layer on the base substrate, the fifth insulation layer, the fourth insulation layer, the third insulation layer, and the second insulation layer in the seventh via V7 are etched away to expose a surface of the first region of the seventh active layer, and the seventh via V7 is configured such that a first electrode of the seventh transistor T7 formed subsequently is connected with the first region of the seventh active layer through the via.

In an exemplary implementation mode, an orthographic projection of the eighth via V8 on the base substrate is located within a range of an orthographic projection of a first region of a first active layer on the base substrate, and the fifth insulation layer, the fourth insulation layer, the third insulation layer, and the second insulation layer in the eighth via V8 are etched away to expose a surface of the first region of the first active layer, and the eighth via V8 is configured such that a first electrode of the first transistor T1 formed subsequently is connected with the first region of the first active layer through the via.

In an exemplary implementation mode, an orthographic projection of the ninth via V9 on the base substrate is located within a range of an orthographic projection of a second region of a second active layer on the base substrate, the fifth insulation layer in ninth via V9 is etched away to expose a surface of the second region of the second active layer, and the ninth via V9 is configured such that a second electrode of the second transistor T2 formed subsequently is connected with the second region of the second active layer through the via.

In an exemplary implementation mode, an orthographic projection of the tenth via V10 on the base substrate is located within a range of an orthographic projection of a second region of the first active layer on the base substrate, the fifth insulation layer, the fourth insulation layer, the third insulation layer, and the second insulation layer in the tenth via V10 are etched away to expose a surface of the second region of the first active layer (also is the first region of the second active layer), and the tenth via V10 is configured such that the second electrode of the first transistor T1 (also is the first electrode of the second transistor T2) formed subsequently is connected with the second region of the first active layer through the via.

In an exemplary implementation mode, an orthographic projection of the eleventh via V11 on the base substrate is located within a range of an orthographic projection of the first initial signal line 31 on the base substrate, the fifth insulation layer and the fourth insulation layer in the eleventh via V11 are etched away to expose a surface of the first initial signal line 31, and the eleventh via V11 is configured such that the first electrode of the first transistor T1 formed subsequently is connected with the first initial signal line 31 through the via.

Figure 13A:
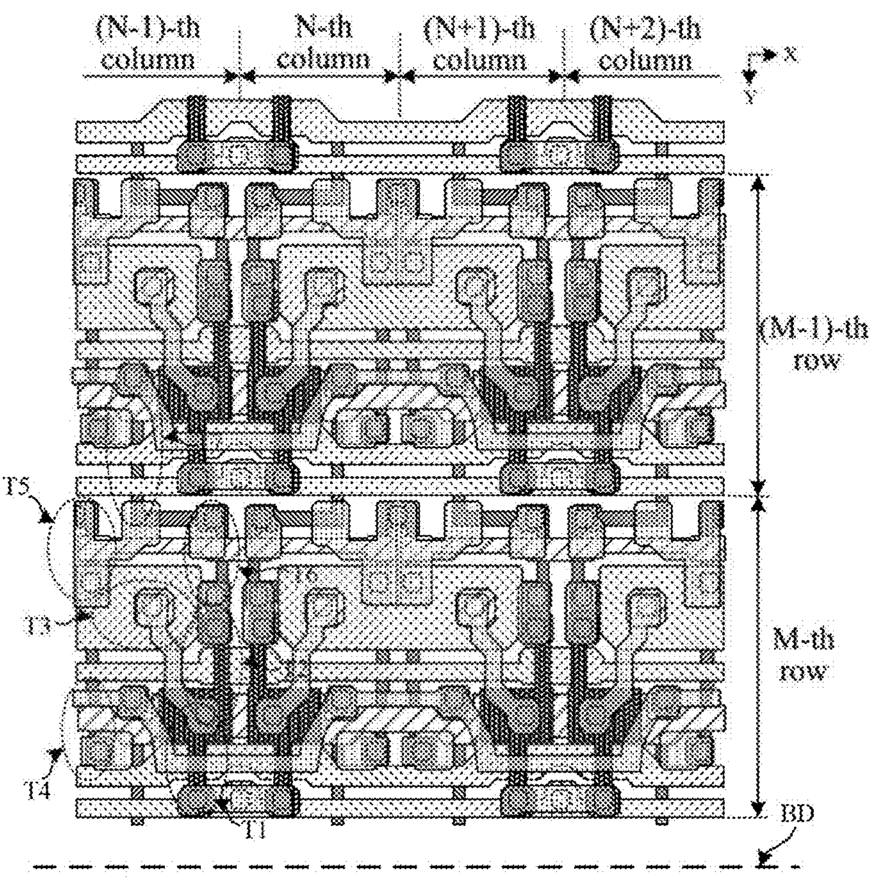
FIG. 13*a* and FIG. 13*b* are schematic diagrams after a pattern of a third conductive layer is formed according to an embodiment of the present disclosure.
Figure 13B:
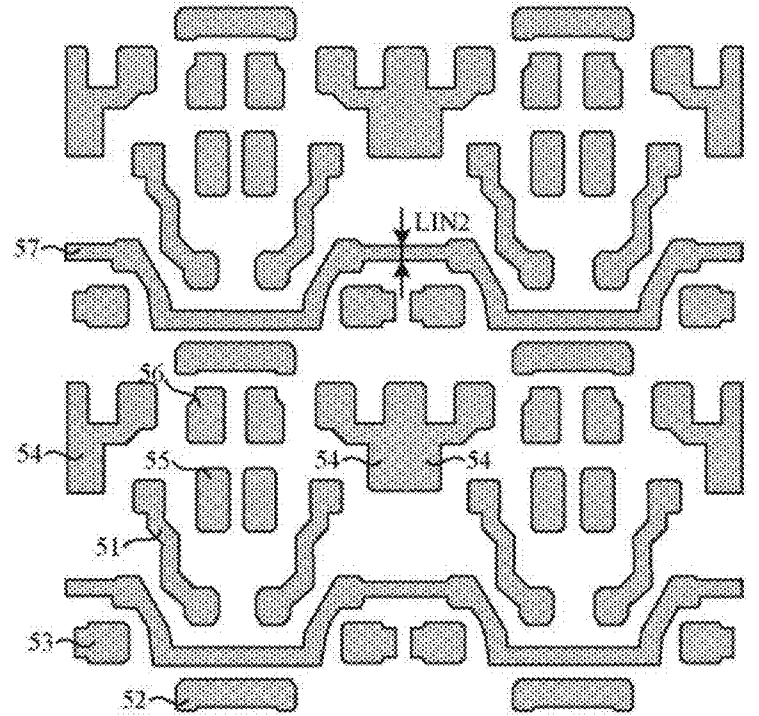

(7) A pattern of a third conductive layer is formed. In an exemplary implementation mode, forming a third conductive layer may include: depositing a third conductive thin film on the base substrate on which the above-mentioned patterns are formed, and patterning the third conductive thin film through a patterning process to form the third conductive layer arranged on the fifth insulation layer, as shown in FIG. 13*a* and FIG. 13*b*, and FIG. 13*b* is a planar schematic diagram of the third conductive layer in FIG. 13*a*. In an exemplary implementation mode, the third conductive layer may be referred to as a third gate metal (GATE3) layer.

In an exemplary implementation mode, the third conductive layer of each sub-pixel at least includes a first connection electrode 51, a second connection electrode 52, a third connection electrode 53, a fourth connection electrode 54, a fifth connection electrode 55, a sixth connection electrode 56, and a second initial signal line 57.

In an exemplary implementation mode, the first connection electrode 51 may be of a polygonal line shape of which a main body portion extends along the second direction Y, a first end of the first connection electrode 51 is connected with the first electrode plate 24 through the first via V1, and a second end of the first connection electrode 51 is connected with the second region of the first active layer (also is the first region of the second active layer) through the tenth via V10 after extending along the second direction Y, so that the first electrode plate 24, the second electrode of the first transistor T1, and the first electrode of the second transistor T2 have a same potential. In an exemplary implementation mode, the first connection electrode 51 may simultaneously serve as the second electrode of the first transistor T1 and the first electrode (a second node N2) of the second transistor T2.

In an exemplary implementation mode, the second connection electrode 52 may be of a strip shape extending along the first direction X, a first end of the second connection electrode 52 is connected with the first region of the first active layer through the eighth via V8, and a second end of the second connection electrode 52 is connected with the first initial signal line 31 through the eleventh via V11, so that a first initial voltage transmitted by the first initial signal line 31 is written into the first electrode of the first transistor T1. In an exemplary implementation mode, the second connection electrode 52 may serve as the first electrode of the first transistor T1.

In an exemplary implementation mode, in each pixel row, a second connection electrode 52 of the (N−1)-th column and a second connection electrode 52 of the N-th column may be of an interconnected integral structure, and a second connection electrode 52 of the (N+1)-th column and a second connection electrode 52 of the (N+2)-th column may be of an interconnected integral structure.

In an exemplary implementation mode, the third connection electrode 53 may have a rectangular shape, and the third connection electrode 53 is connected with the first region of the fourth active layer through the fifth via V5. In an exemplary implementation mode, the third connection electrode 53 may serve as the first electrode of the fourth transistor T4, and is configured to be connected with a data signal line formed subsequently.

In an exemplary implementation mode, the fourth connection electrode 54 may have a "Y" shape, a first end of the fourth connection electrode 54 is connected with the second electrode plate 34 through the second via V2, and a second end of the fourth connection electrode 54 is connected with the first region of the fifth active layer through the third via V3, thereby achieving that the first electrode of the fifth transistor T5 and the second electrode plate 34 of the storage capacitor in the sub-pixel have a same potential. In an exemplary implementation mode, the fourth connection electrode 54 may serve as the first electrode of the fifth transistor T5.

In an exemplary implementation mode, an orthographic projection of the fourth connection electrode 54 on the base substrate is at least partially overlapped with an orthographic projection of the second region of the seventh active layer on the base substrate.

In an exemplary implementation mode, in each pixel row, a fourth connection electrode 54 of the (N−2)-th column and a fourth connection electrode 54 of the (N−1)-th column may be of an interconnected integral structure, a fourth connection electrode 54 of the N-th column and a fourth connection electrode 54 of the (N+1)-th column may be of an interconnected integral structure, and a fourth connection electrode 54 of the (N+2)-th column and a fourth connection electrode 54 of the (N+3)-th column may be of an interconnected integral structure. In an exemplary implementation mode, since a fourth connection electrode 54 in each sub-pixel is connected with a first power supply line formed subsequently, by forming fourth connection electrodes 54 of adjacent sub-pixels into an interconnected integral structure, the fourth connection electrodes 54 of adjacent sub-pixels may be ensured to have a same potential, which thus enabling first electrodes of fifth transistors T5 in the adjacent sub-pixels to have a same potential, and enabling second electrode plates 34 of storage capacitors in the adjacent sub-pixels to have a same potential, which is beneficial to improving uniformity of the panel, avoiding poor display of the display substrate, and ensuring the display effect of the display substrate.

In an exemplary implementation mode, the fifth connection electrode 55 may be in a shape of a rectangle, a first end of the fifth connection electrode 55 is connected with the second region of the third active layer (also is the first region of the sixth active layer) through the sixth via V6, and a second end of the fifth connection electrode 55 is connected with the second region of the second active layer through the ninth via V9. The fifth connection electrode 55 may simultaneously serve as the second electrode of the second transistor T2, the second electrode of the third transistor T3, and the first electrode (a third node N3) of the sixth transistor T6.

In an exemplary implementation mode, the sixth connection electrode 56 may be of a rectangular shape, and the sixth connection electrode 56 is connected with the second region of the sixth active layer (also is the second region of the seventh active layer) through the fourth via V4. In an exemplary implementation mode, the sixth connection electrode 56 may serve as the second electrode of the sixth transistor T6 and the second electrode of the seventh transistor T7 simultaneously, and the sixth connection electrode 56 is configured to be connected with an anode connection electrode formed subsequently.

In an exemplary implementation mode, the second initial signal line 57 may be in a shape of a polygonal line of which a main body portion extends along the first direction X, the second initial signal line 57 may be arranged on a side of the storage capacitor away from the display region boundary BD, and the second initial signal line 57 is connected with first regions of a plurality of seventh active layers through a plurality of seventh vias V7 in a pixel row to write a second initial voltage to a plurality of seventh transistors T7 in the pixel row. In an exemplary implementation mode, since the second initial signal line 57 is connected with first regions of all seventh active layers in a pixel row, first electrodes of all seventh transistors T7 in the pixel row may be ensured to have a same potential, which is beneficial to improving uniformity of the panel, avoiding poor display of the display substrate, and ensuring the display effect of the display substrate. In an exemplary implementation mode, a width LIN2 of the second initial signal line 57 may be about 1.9 μm to 2.3 μm. For example, the width of the second initial signal line 57 may be about 2.1 μm.

In an exemplary implementation mode, a second initial signal line 57 of an (i−1)-th pixel row may be located within a region where the (i−1)-th pixel row is located.

Figure 14:
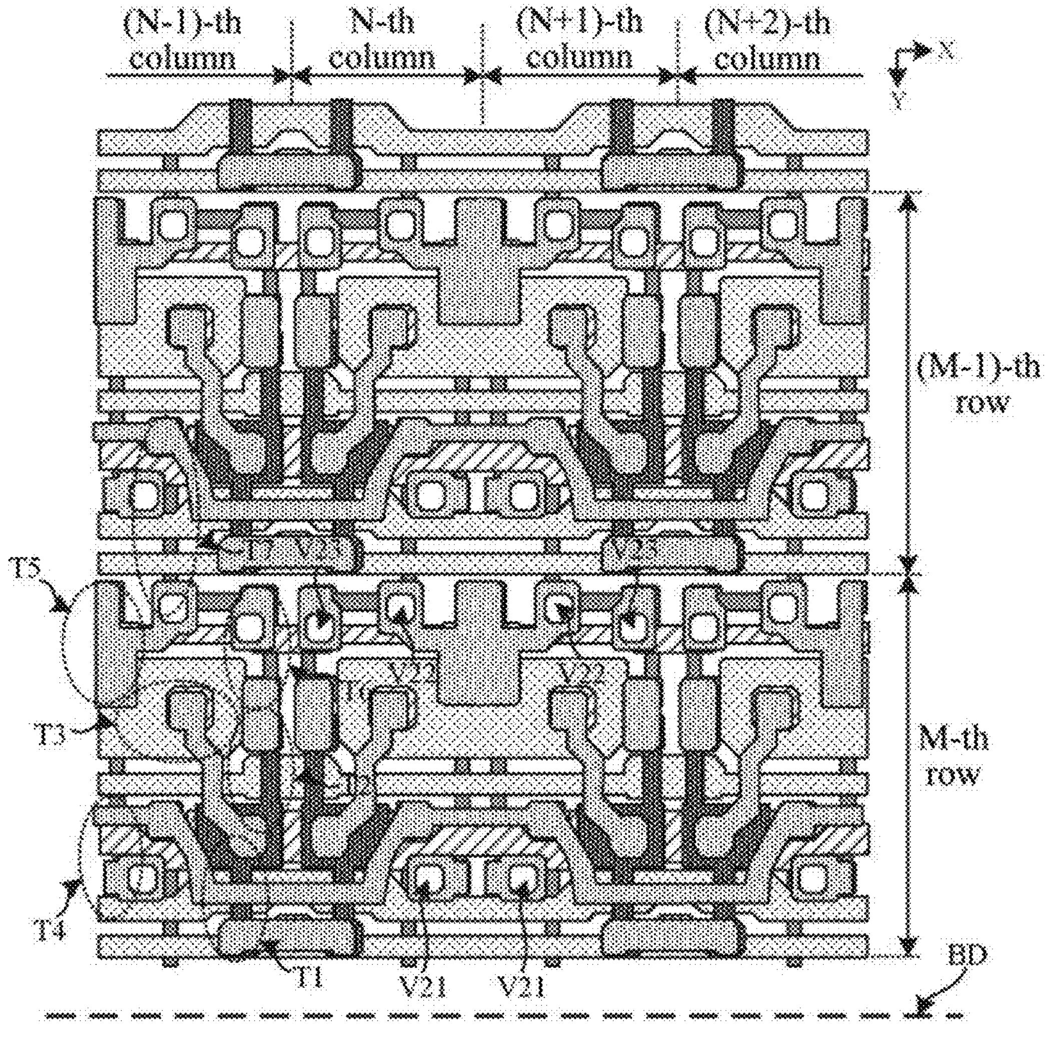
FIG. 14 is a schematic diagram after a pattern of a first planarization layer is formed according to an embodiment of the present disclosure.

(8) A pattern of a first planarization layer is formed. In an exemplary implementation mode, forming a pattern of a first planarization layer may include: coating a first planarization thin film on the base substrate on which the aforementioned patterns are formed, patterning the first planarization thin film through a patterning process to form the first planarization layer covering the pattern of the third conductive layer, and the first planarization layer is provided with a plurality of vias, as shown in FIG. 14.

In an exemplary implementation mode, the plurality of vias in each sub-pixel at least include a twenty-first via V21, a twenty-second via V22, and a twenty-third via V23.

In an exemplary implementation mode, an orthographic projection of the twenty-first via V21 on the base substrate is located within a range of an orthographic projection of the third connection electrode 53 on the base substrate, the first planarization layer in the twenty-first via V21 is etched away to expose a surface of the third connection electrode 53, and the twenty-first via V21 is configured such that a data signal line formed subsequently is connected with the third connection electrode 53 through the via.

In an exemplary implementation mode, an orthographic projection of the twenty-second via 22 on the base substrate is located within a range of an orthographic projection of a first sub-electrode 54-1 of the fourth connection electrode 54 on the base substrate, the first planarization layer in the twenty-second via V22 is etched away to expose a surface of the first sub-electrode 54-1, and the twenty-second via V22 is configured such that a first power supply line formed subsequently is connected with the fourth connection electrode 54 through the via.

In an exemplary implementation mode, an orthographic projection of the twenty-third via V23 on the base substrate is within a range of an orthographic projection of the sixth connection electrode 56 on the base substrate, the first planarization layer in the twenty-third via V23 is etched away to expose a surface of the sixth connection electrode 56, and the twenty-third via V23 is configured such that an anode connection electrode formed subsequently is connected with the sixth connection electrode 56 through the via.

Figure 15A:
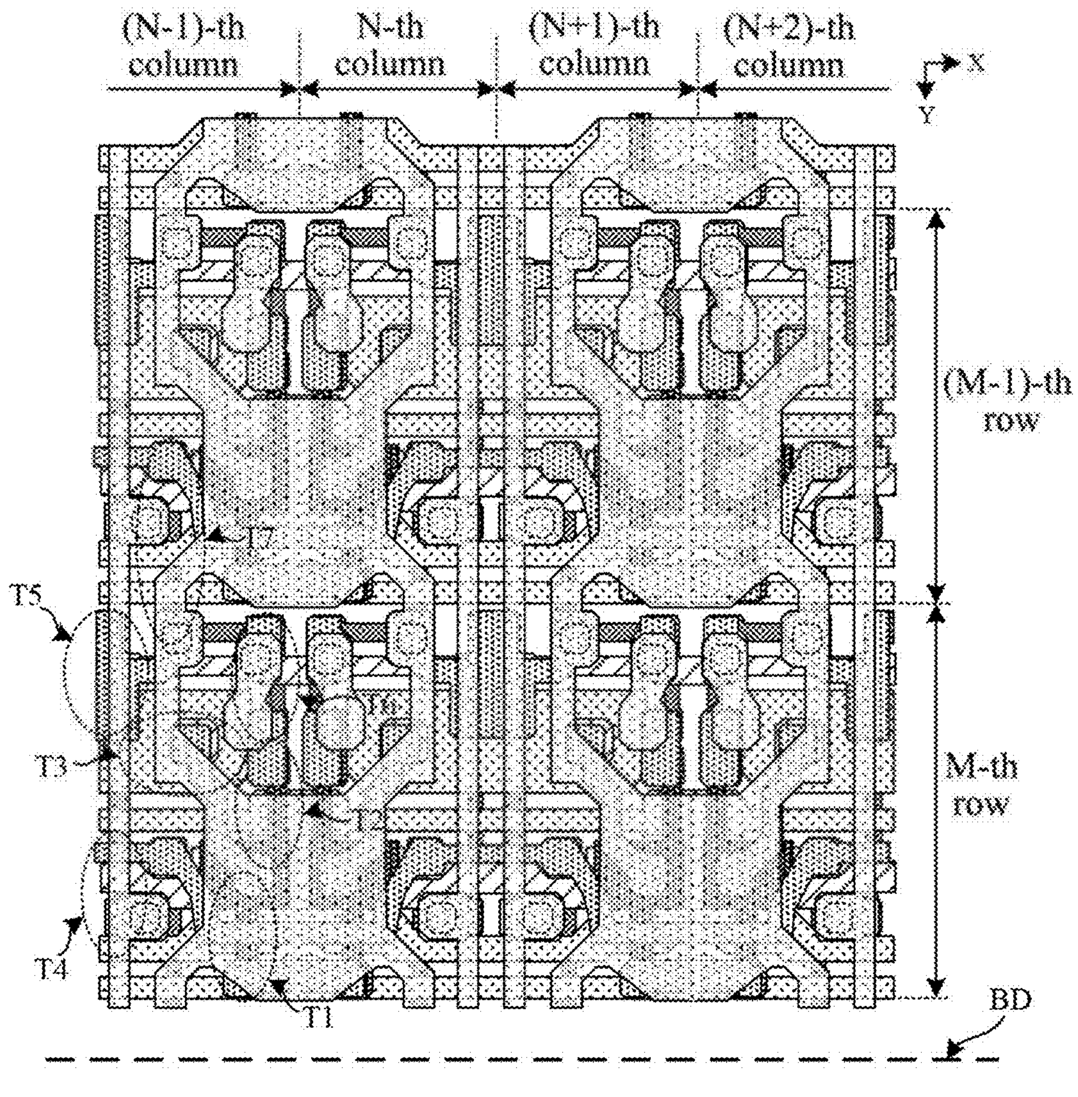
FIG. 15*a* and FIG. 15*b* are schematic diagrams after a pattern of a fourth conductive layer is formed according to an embodiment of the present disclosure.
Figure 15B:
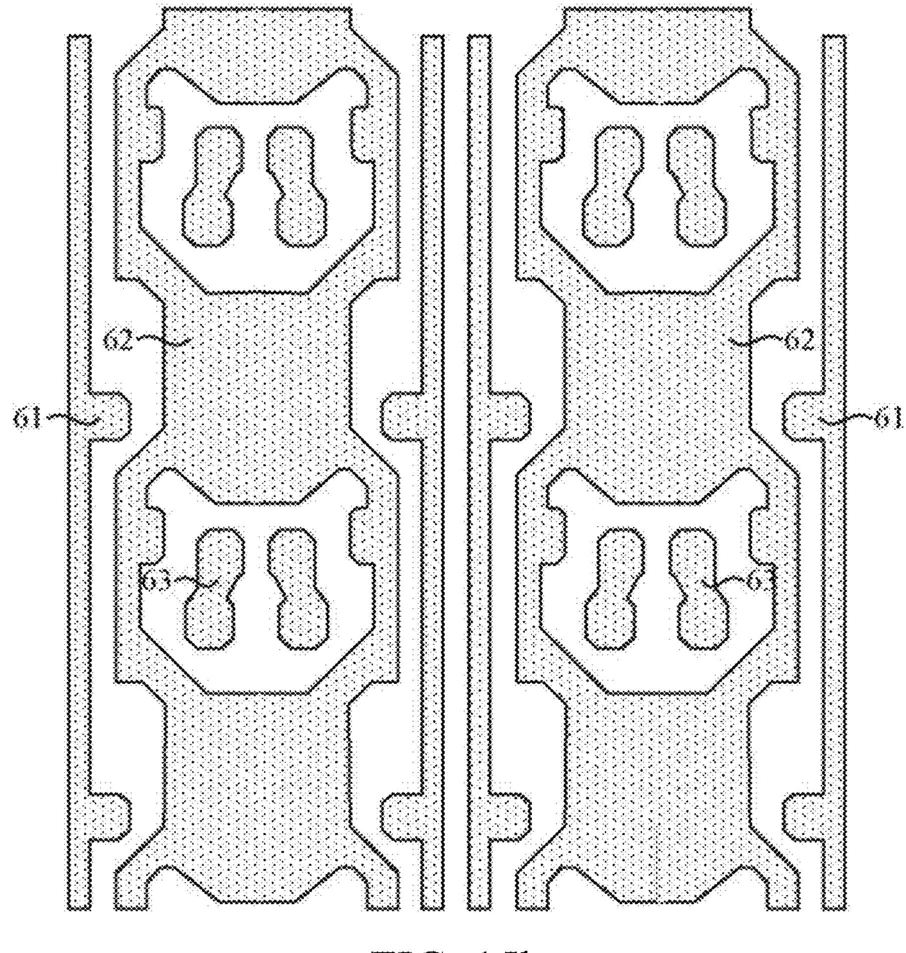

(9) A pattern of a fourth conductive layer is formed. In an exemplary implementation mode, forming a pattern of a fourth conductive layer may include: depositing a fourth conductive thin film on the base substrate on which the aforementioned patterns are formed, and patterning the fourth conductive thin film through a patterning process to form the fourth conductive layer arranged on the first planarization layer, as shown in FIG. 15*a* and FIG. 15*b*, and FIG. 15*b* is a planar schematic diagram of the fourth conductive layer in FIG. 15*a*. In an exemplary implementation mode, the fourth conductive layer may be referred to as a first source drain metal (SD1) layer.

In an exemplary implementation mode, the fourth conductive layer of each sub-pixel at least includes a data signal line 61, a first power supply line 62, and an anode connection electrode 63.

In the exemplary implementation mode, the data signal line 61 may be in a shape of a straight line of which a main body portion extends along the second direction Y, and the data signal line 61 is connected with the third connection electrode 53 through the twenty-first via V21. Since the third connection electrode 53 is connected with the first region of the fourth active layer through the via, a connection of the data signal line 61 with the first electrode of the fourth transistor T4 is achieved, and a data signal is written into the first electrode of the fourth transistor T4.

In an exemplary implementation mode, the first power supply line 62 may be in a shape of a polygonal line of which a main body portion extends along the second direction Y, and the first power supply line 62 is connected with the fourth connection electrode 54 through the twenty-second via V22. Since the fourth connection electrode 54 is connected with the second electrode plate 34 and the first region of the fifth active layer through a via, respectively, a connection of the first power supply line 62 with the second electrode plate 34 and the first electrode of the fifth transistor T5 is achieved, and a power supply signal is written into the first electrode of the fifth transistor T5.

In an exemplary implementation mode, first power supply lines 62 of two adjacent sub-pixels in one pixel row may be of an interconnected integral structure. For example, a first power supply line 62 of the (N−1)-th column and a first power supply line 62 of the N-th column are connected with each other, and a first power supply line 62 of the (N+1)-th column and a first power supply line 62 of the (N+2)-th column are connected with each other. In an exemplary implementation mode, by forming first power supply lines 62 of adjacent sub-pixels into an interconnected integral structure, the first power supply lines 62 of the adjacent sub-pixels may be ensured to have a same potential, which is beneficial to improving uniformity of the panel, avoiding poor display of the display substrate, and ensuring the display effect of the display substrate.

In an exemplary implementation mode, the first power supply lines 62 may be of polygonal lines with unequal widths, which may not only facilitate a layout of a pixel structure, but also reduce a parasitic capacitance between a first power supply line and a data signal line.

In an exemplary implementation mode, an orthographic projection of the first power supply line 62 on the base substrate may be at least partially overlapped with an orthographic projection of the first connection electrode 51 on the base substrate, the orthographic projection of the first power supply line 62 on the base substrate may be at least partially overlapped with an orthographic projection of the second connection electrode 52 on the base substrate, so that the first power supply line 62 may be used as a shielding electrode, which may effectively shield an influence of data voltage jump on a key node in a pixel drive circuit, preventing the data voltage jump from affecting a potential of the key node of the pixel drive circuit and improving the display effect.

In an exemplary implementation mode, the anode connection electrode 63 may be of a rectangular shape, the anode connection electrode 63 is connected with the sixth connection electrode 56 through the twenty-third via V23, and the anode connection electrode 63 is configured to be connected with an anode formed subsequently.

Figure 16:
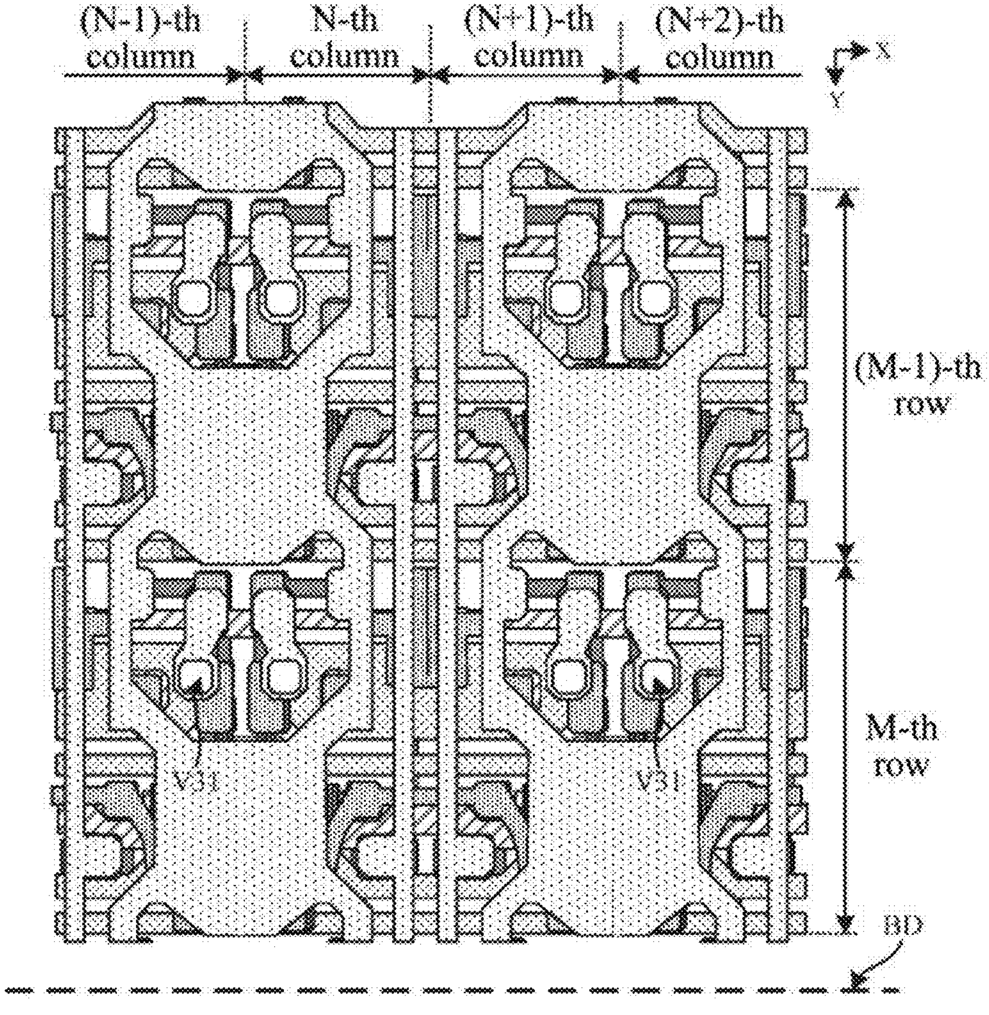
FIG. 16 is a schematic diagram after a pattern of a second planarization layer is formed according to an embodiment of the present disclosure.

(10) A pattern of a second planarization layer is formed. In an exemplary implementation mode, forming a pattern of a second planarization layer may include: coating a second planarization thin film on the base substrate on which the aforementioned patterns are formed, patterning the second planarization thin film through a patterning process to form the second planarization layer covering the pattern of the fourth conductive layer, and the second planarization layer is provided with a plurality of vias, as shown in FIG. 16.

In an exemplary implementation mode, the via of each sub-pixel at least includes a thirty-first via V31.

In an exemplary implementation mode, an orthographic projection of the thirty-first via V31 on the base substrate is located within a range of an orthographic projection of the anode connection electrode 63 on the base substrate, the second planarization layer in the thirty-first via V31 is removed to expose a surface of the anode connection electrode 63, and the thirty-first via V31 is configured such that the anode formed subsequently is connected with the anode connection electrode 63 through the via.

Hereto, preparation of a drive circuit layer on a base substrate is completed. In a plane parallel to a display substrate, the drive circuit layer may include a plurality of sub-pixels, wherein each of the sub-pixels may include a pixel drive circuit, and a first scan signal line, a second scan signal line, a third scan signal line, a light emitting control line, a data signal line, a first power supply line, a first initial signal line, and a second initial signal line which are connected with the pixel drive circuit. In a plane perpendicular to the display substrate, the drive circuit layer may include a first insulation layer, a first semiconductor layer, a second insulation layer, a first conductive layer, a third insulation layer, a second conductive layer, a fourth insulation layer, a second conductive layer, a fifth insulation layer, a third conductive layer, a first planarization layer, a fourth conductive layer, and the second planarization layer which are arranged sequentially on the base substrate. The first semiconductor layer at least includes active layers of a third transistor to a seventh transistor, the first conductive layer at least includes gate electrodes of the third transistor to the seventh transistor and a first electrode plate of a storage capacitor, the second conductive layer at least includes gate electrodes of a first transistor to a second transistor and a second electrode plate of the storage capacitor, the second semiconductor layer at least includes active layers of the first transistor to the second transistor, the third conductive layer at least includes first electrodes and second electrodes of a plurality of transistors, and the fourth conductive layer at least includes a data signal line and a first power supply line.

In an exemplary implementation mode, the first conductive layer, the second conductive layer, the third conductive layer, and the fourth conductive layer may be made of a metal material, such as any one or more of Argentum (Ag), Copper (Cu), Aluminum (A1), and Molybdenum (Mo), or an alloy material of the above metals, such as an Aluminum Neodymium alloy (AlNd) or a Molybdenum Niobium alloy (MoNb), and may be of a single-layer structure or a multi-layer composite structure, such as Mo/Cu/Mo. The first insulation layer, the second insulation layer, the third insulation layer, the fourth insulation layer, and the fifth insulation layer may be made of any one or more of Silicon Oxide (SiOx), Silicon Nitride (SiNx), and Silicon Oxynitride (SiON), and may be in a single layer, a multi-layer, or a composite layer. The first insulation layer may be referred to as a buffer layer and used for improving a water and oxygen resistance capability of the base substrate, the second insulation layer, the third insulation layer, the fourth insulation layer, and the fifth insulation layer may be referred to as Gate Insulators (GIs), and the fifth insulation layer may be referred to as an Interlayer Dielectric (ILD) layer. The first planarization layer and the second planarization layer may be made of an organic material, such as resin.

In an exemplary implementation mode, pixel drive circuits in two adjacent sub-pixels in one pixel row may be substantially mirror-symmetrical with respect to a first center line, and the first center line is a straight line located between the two adjacent sub-pixels and extending along the second direction Y. For example, a pixel drive circuit of the (N−1)-th column and a pixel drive circuit of the N-th column may be mirror-symmetrical with respect to a first center line. For another example, the pixel drive circuit of the N-th column and a pixel drive circuit of the (N+1)-th column may be mirror-symmetrical with respect to a first center line.

In an exemplary implementation mode, pixel drive circuits in two adjacent sub-pixels may be substantially mirror-symmetrical with respect to a first center line, which may include any one or more of following: first semiconductor layers in two adjacent sub-pixels in one pixel row may be mirror-symmetrical with respect to a first center line, first conductive layers in two adjacent sub-pixels in one pixel row may be mirror-symmetrical with respect to a first center line, second conductive layers in two adjacent sub-pixels in one pixel row may be mirror-symmetrical with respect to a first center line, second semiconductor layers in two adjacent sub-pixels in one pixel row may be mirror-symmetrical with respect to a first center line, third conductive layers in two adjacent sub-pixels in one pixel row may be mirror-symmetrical with respect to a first center line, and fourth conductive layers in two adjacent sub-pixels in one pixel row may be mirror symmetrical with respect to a first center line.

In an exemplary implementation mode, after preparation of the driver circuit layer is completed, a light emitting structure layer is prepared on the driver circuit layer, and a preparation process of the light emitting structure layer may include following operations.

Figure 17A:
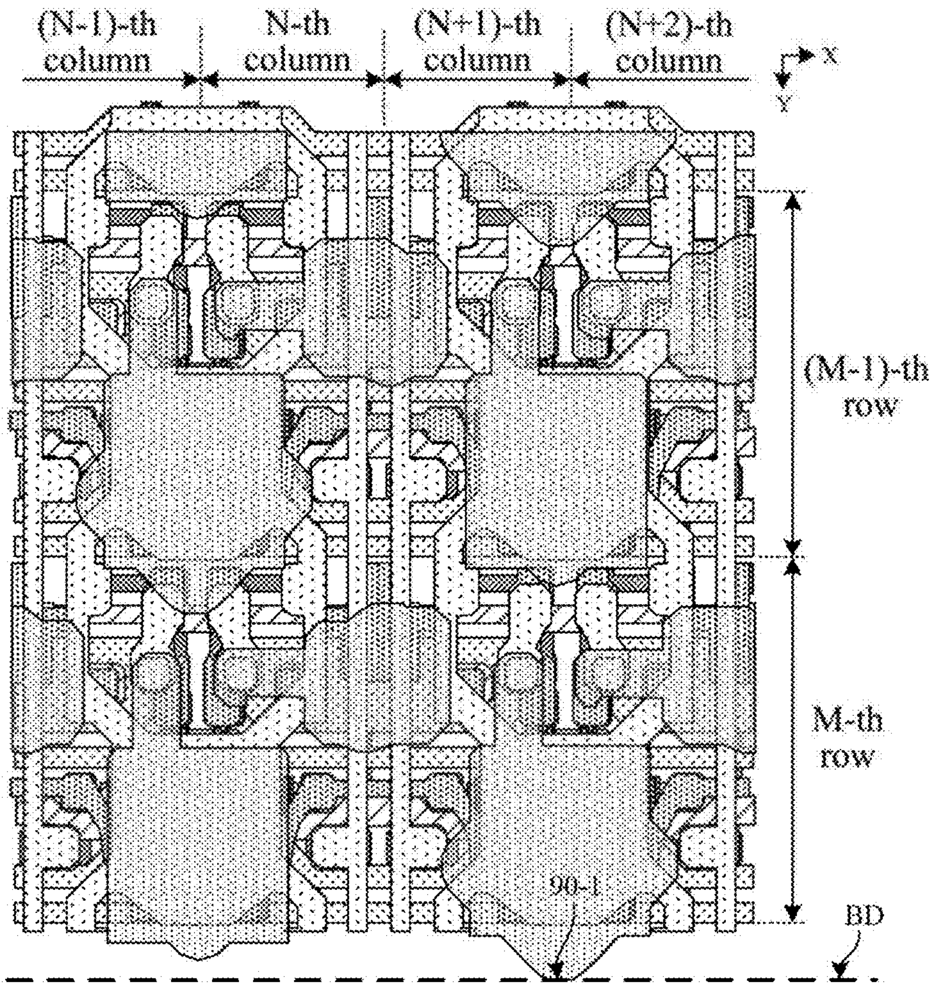
FIG. 17*a* to FIG. 17*d* are schematic diagrams after a pattern of an anode conductive layer is formed according to an embodiment of the present disclosure.
Figure 17B:
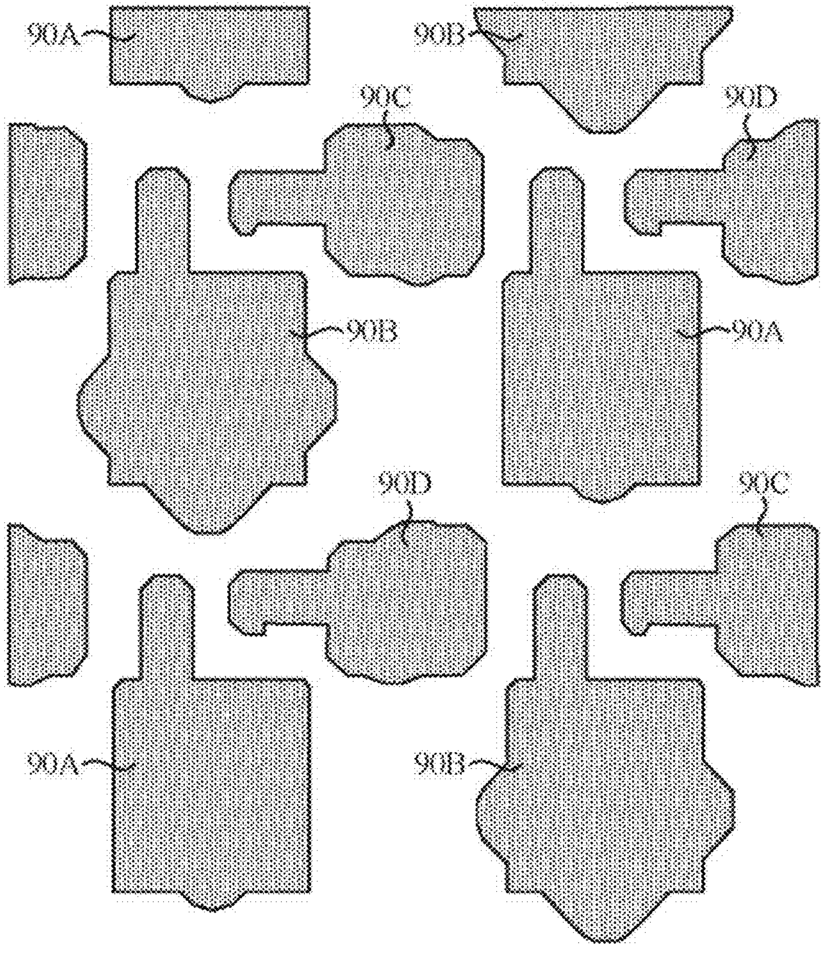
Figure 17C:
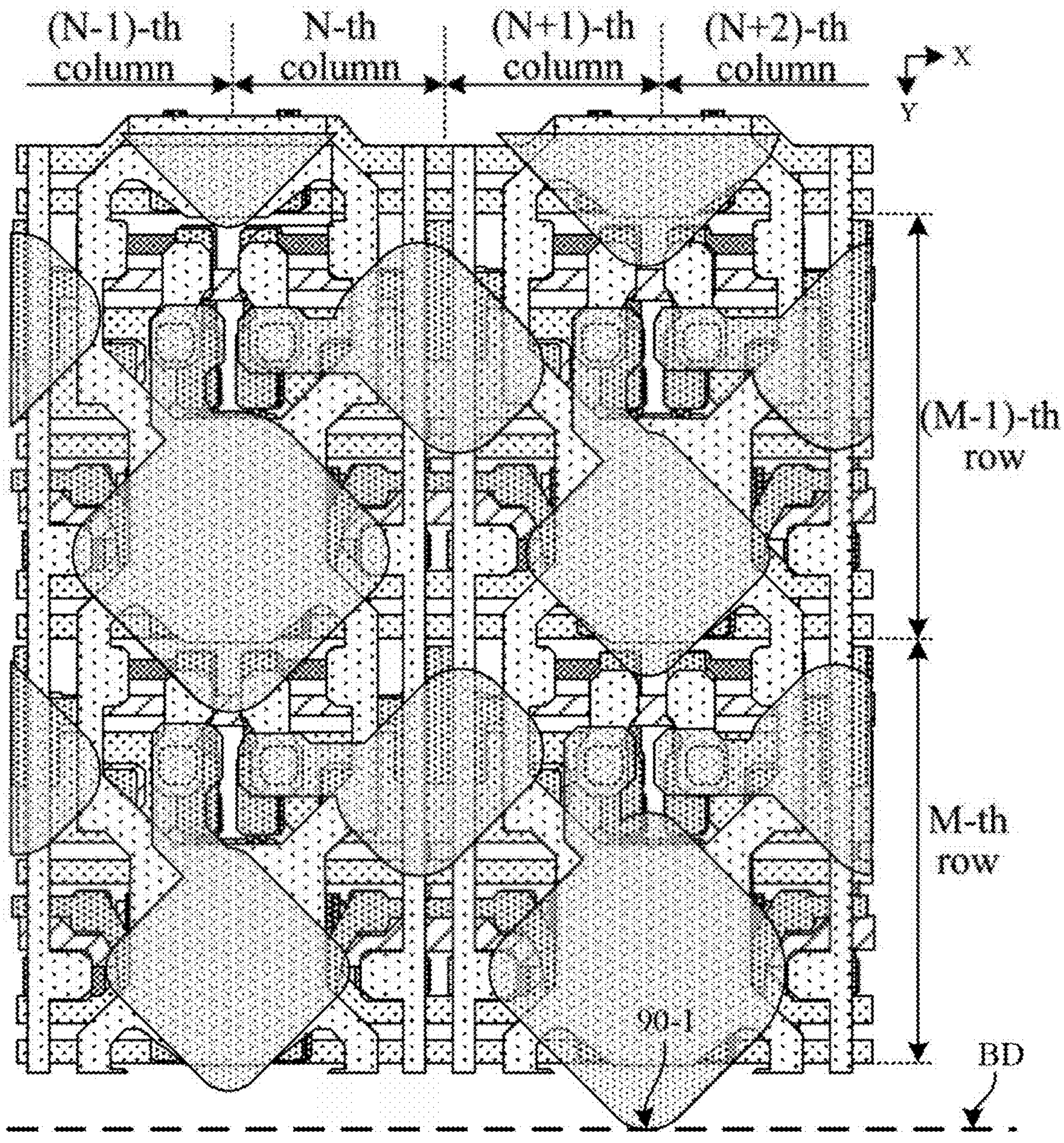
Figure 17D:
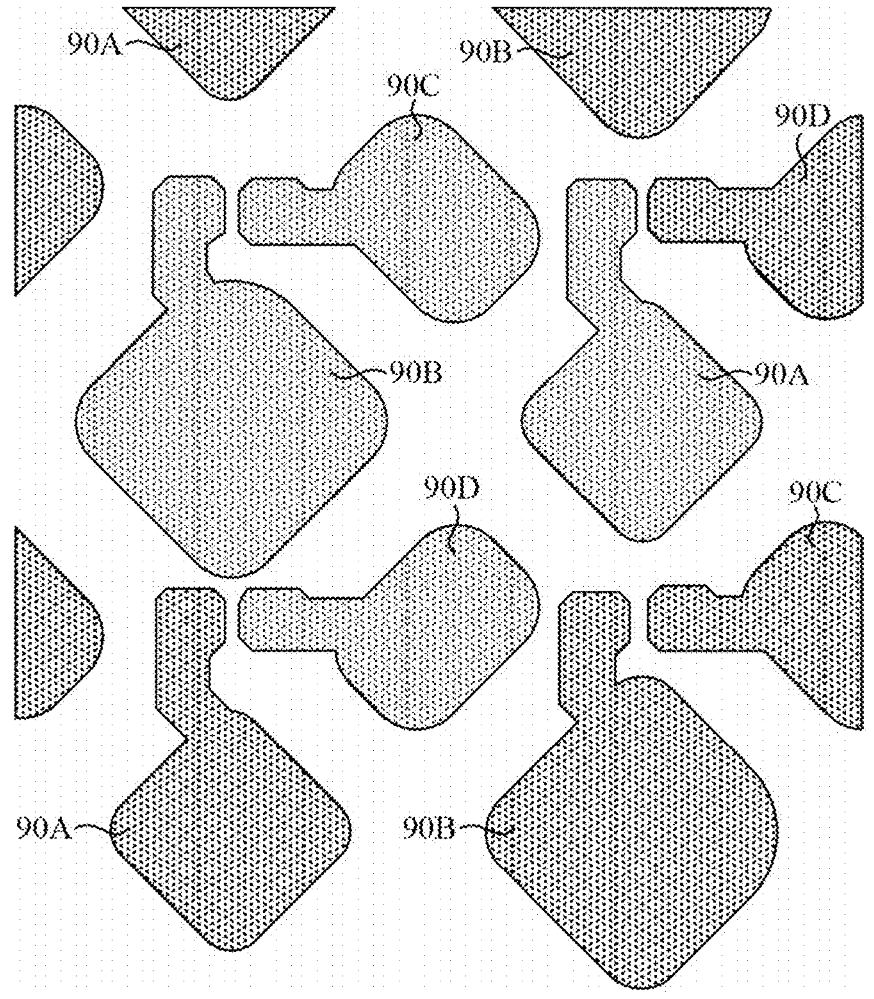

(11) A pattern of an anode conductive layer is formed. In an exemplary implementation mode, forming a pattern of an anode conductive layer may include: depositing an anode conductive thin film on the base substrate on which the aforementioned patterns are formed, and patterning the anode conductive thin film through a patterning process to form the anode conductive layer arranged on the second planarization layer, wherein the anode conductive layer at least includes a plurality of anode patterns, as shown in FIG. 17*a* to FIG. 17*d*. FIG. 17*a* is a schematic diagram after a pattern of an anode conductive layer is formed according to an embodiment of the present disclosure. FIG. 17*b* is a planar schematic diagram of the anode conductive layer in FIG. 17*a*, FIG. 17*c* is a schematic diagram after a pattern of another anode conductive layer is formed according to an embodiment of the present disclosure, and FIG. 17*d* is a planar schematic diagram of the anode conductive layer in FIG. 17*c*.

In an exemplary implementation mode, the anode conductive layer may be of a single-layer structure, such as Indium Tin Oxide (ITO) or Indium Zinc Oxide (IZO), or may be of a multi-layer composite structure, such as ITO/Ag/ITO.

In an exemplary implementation mode, the plurality of anode patterns may include a first anode 90A of a red light emitting device, a second anode 90B of a blue light emitting device, a third anode 90C of a first green light emitting device, and a fourth anode 90D of a second green light emitting device, wherein the first anode 90A may be located at a red sub-pixel emitting red light, the second anode 90B may be located at a blue sub-pixel emitting blue light, the third anode 90C may be located at a first green sub-pixel emitting green light, and the fourth anode 90D may be located at a second green sub-pixel emitting green light.

In an exemplary implementation mode, the first anode 90A and the second anode 90B may be sequentially arranged along the second direction Y, the third anode 90C and the fourth anode 90D may be sequentially arranged along the second direction Y, and the third anode 90C and the fourth anode 90D may be arranged on one side of the first anode 90A and the second anode 90B in the first direction X. Or, the first anode 90A and the second anode 90B may be sequentially arranged along the first direction X, the third anode 90C and the fourth anode 90D may be sequentially arranged along the first direction X, and the third anode 90C and the fourth anode 90D may be arranged on one side of the first anode 90A and the second anode 90B in the second direction Y.

In an exemplary implementation mode, the first anode 90A, the second anode 90B, the third anode 90C, and the fourth anode 90D may be respectively connected with an anode connection electrode 63 of a sub-pixel where it is located through the thirty-first via V31, and shapes and areas of anodes of four sub-pixels in one pixel unit may be the same or may be different.

In an exemplary implementation mode, for a plurality of anodes arranged in the display region, each anode has an edge close to a side of the bonding region, an edge in the plurality of anodes closest to the bonding region is referred to as an anode boundary 90-1, and the display region boundary BD according to the exemplary embodiment of the present disclosure is a straight line passing through the anode boundary 90-1 and extending along the first direction X.

In an exemplary implementation mode, at least one of the first anode 90A, the second anode 90B, the third anode 90C, and the fourth anode 90D may include an anode main body portion and an anode connection portion connected with each other, and the anode connection portion is connected with the anode connection electrode 63 through the thirty-first via V31.

In an exemplary implementation mode, the first anode 90A may include a first anode main body portion and a first anode connection portion connected with each other, wherein the first anode main body portion may be of a rectangular shape, a circular arc-shaped chamfer may be provided at a corner of the rectangular shape, the first anode connection portion may be of a strip shape extending along the second direction Y, and the first anode connection portion is connected with the anode connection electrode 63 through the thirty-first via V31.

In an exemplary implementation mode, the second anode 90B may include a second anode main body portion and a second anode connection portion connected with each other, wherein the second anode main body portion may be of a rectangular shape, a circular arc-shaped chamfer may be provided at a corner of the rectangular shape, the second anode connection portion may be of a strip shape extending along the second direction Y, and the second anode connection portion is connected with the anode connection electrode 63 through the thirty-first via V31.

In an exemplary implementation mode, the third anode 90C may include a third anode main body portion and a third anode connection portion connected with each other, wherein the third anode main body portion may be of a rectangular shape, a circular arc-shaped chamfer may be provided at a corner of the rectangular shape, the third anode connection portion may be of a strip shape extending along the first direction X, and the third anode connection portion is connected with the anode connection electrode 63 through the thirty-first via V31.

In an exemplary implementation mode, the fourth anode 90D may include a fourth anode main body portion and a fourth anode connection portion connected with each other, wherein the fourth anode main body portion may be of a rectangular shape, a circular arc-shaped chamfer may be provided at a corner of the rectangular shape, the fourth anode connection portion may be of a strip shape extending along the first direction X, and the fourth anode connection portion is connected with the anode connection electrode 63 through the thirty-first via V31.

In an exemplary implementation mode, a subsequent preparation process may include: forming a pattern of a pixel definition layer at first, then forming an organic emitting layer using an evaporation process and inkjet printing process, then forming a cathode on the organic emitting layer, and then forming an encapsulation structure layer, wherein the encapsulation structure layer may include a first encapsulation layer, a second encapsulation layer, and a third encapsulation layer which are stacked, the first encapsulation layer and the third encapsulation layer may be made of an inorganic material, the second encapsulation layer may be made of an organic material, and the second encapsulation layer is arranged between the first encapsulation layer and the third encapsulation layer, which may ensure that external water vapor cannot enter the light emitting structure layer.

Figure 18A:
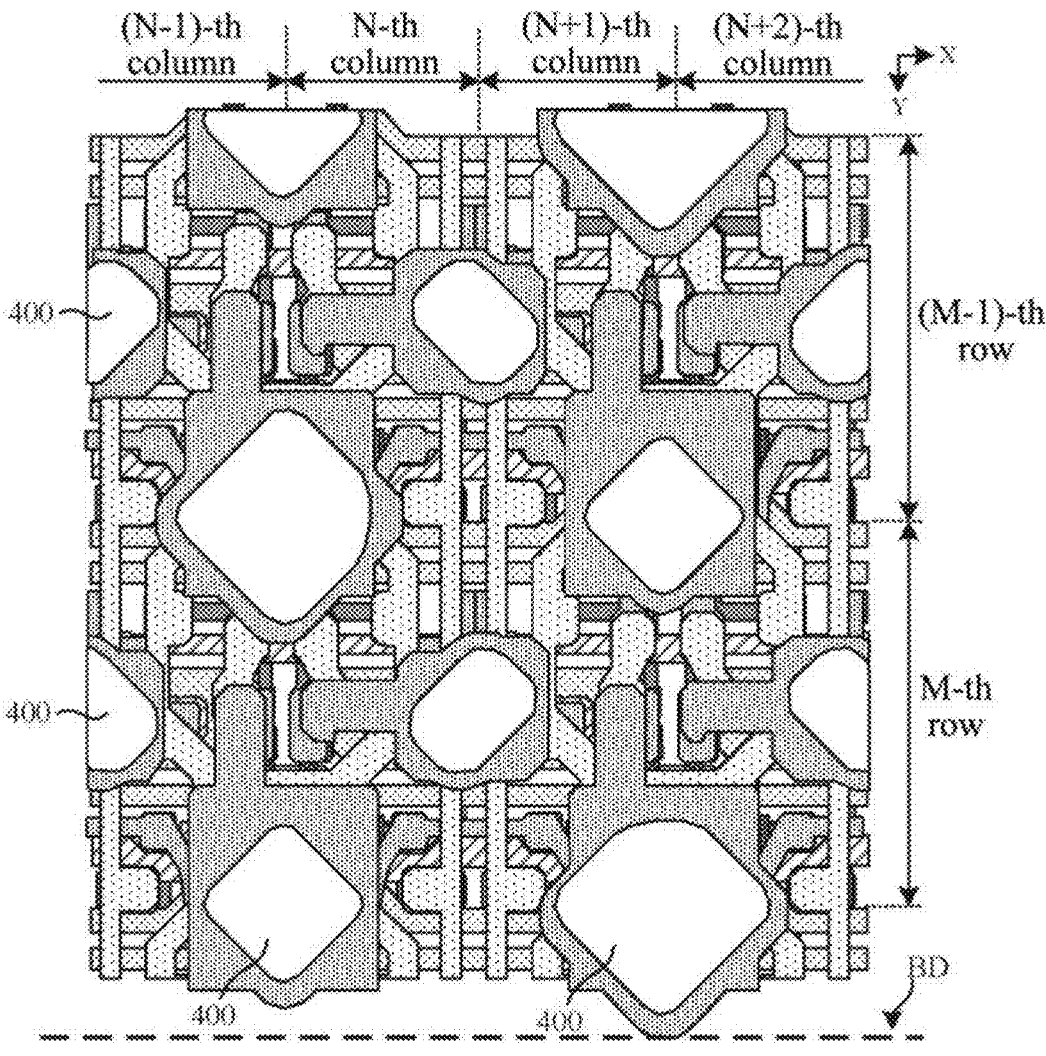
FIG. 18*a* and FIG. 18*b* are schematic diagrams after a pattern of a pixel definition layer is formed according to an embodiment of the present disclosure.
Figure 18B:
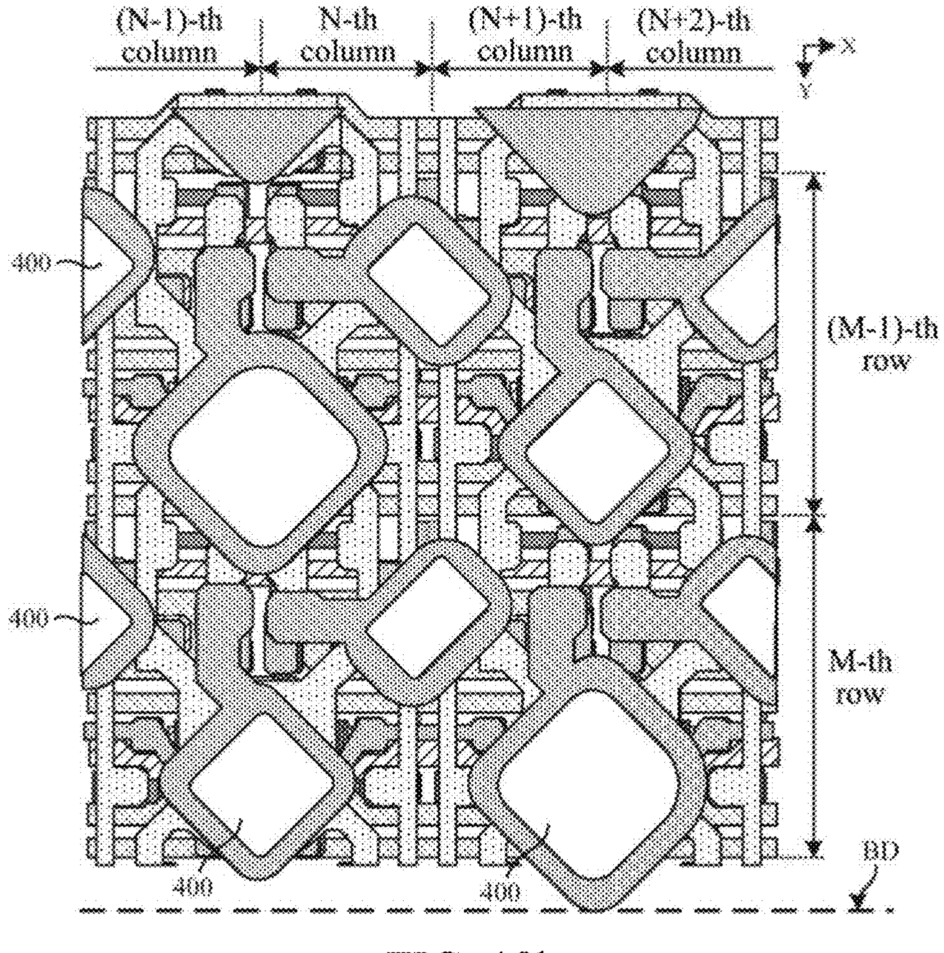

(12) A pattern of a pixel definition layer is formed. In an exemplary implementation mode, forming a pattern of a pixel definition layer may include: coating a pixel definition thin film on the base substrate on which the aforementioned patterns are formed, and patterning the pixel definition thin film through a patterning process to form a pixel definition layer covering the pattern of the anode conductive layer, wherein a plurality of pixel openings 400 are provided on the pixel definition layer, and the pixel definition thin film in the pixel openings 400 is removed to expose a surface of an anode 90, as shown in FIG. 18*a* and FIG. 18*b*. FIG. 18*a* is a schematic diagram after a pattern of a pixel definition layer is formed according to an embodiment of the present disclosure, and FIG. 17*b* is a schematic diagram after a pattern of another pixel definition layer is formed according to an embodiment of the present disclosure.

In one possible exemplary implementation mode, for a plurality of pixel openings arranged in the display region, each pixel opening has an edge close to a side of the bonding region, wherein an edge in the plurality of pixel openings closest to the bonding region is referred to as a pixel opening boundary, and the display region boundary BD according to the exemplary embodiment of the present disclosure may be a straight line passing through the pixel opening boundary and extending along the first direction X.

Figure 19:
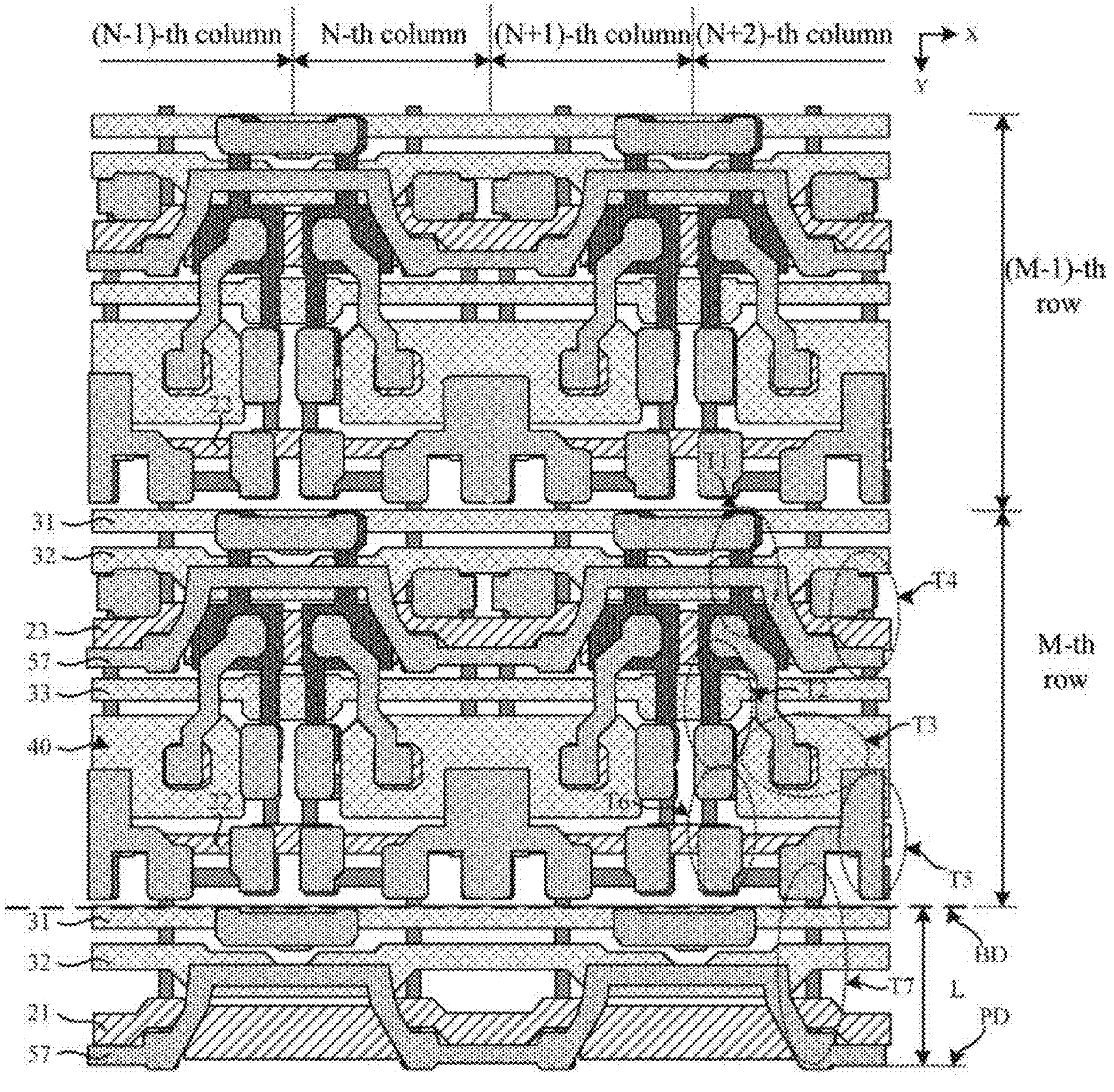
FIG. 19 is a schematic diagram of a planar structure of an existing display substrate.

FIG. 19 is a schematic diagram of a planar structure of an existing display substrate, and is a structure of pixel drive circuits of an (M−1)-th pixel row and an M-th pixel row close to a bonding region in a display region. As shown in FIG. 19, a layout of pixel drive circuits in the existing display substrate is that a first transistor T1, a second transistor T2, and a fourth transistor T4 are located on a side of a third transistor T3 of a present sub-pixel away from a display region boundary BD, and a fifth transistor T5, a sixth transistor T6, and a seventh transistor T7 are located on a side of the third transistor T3 of the present sub-pixel close to the display region boundary BD. According to characteristics of this layout, in order to achieve common use of a second electrode of a sixth transistor T6 and a second electrode of a seventh transistor T7 of a sub-pixel in an i-th pixel row, the seventh transistor T7 in the sub-pixel of the i-th pixel row is designed to be driven by a first scan signal line 21 in a sub-pixel of an (i+1)-th pixel row (a next row), and i=1, 2, . . . , M. Due to this drive characteristics, a pixel drive circuit of a sub-pixel of an M-th pixel row (a last row) needs to be additionally provided with a first scan signal line 21 of a next row for driving a seventh transistor T7 and a second initial signal line 57 of the next row for providing a second initial signal, wherein the first scan signal line 21 and the second initial signal line 57 which are additionally provided can only be provided outside the display region, that is, signal lines such as the first scan signal line 21 and the second initial signal line 57 which are additionally provided are located on a side of the display region boundary BD close to the bonding region. Since a pixel drive circuit boundary PD formed by the first scan signal line 21 and the second initial signal line 57 which are additionally provided exceeds the display region boundary BD, the bonding region can only be arranged correspondingly by taking the pixel drive circuit boundary PD as a basis, thereby increasing a width of a down border. In an exemplary implementation mode, an exceeding distance B between the display region boundary BD and the pixel drive circuit boundary PD is about 20 μm to 30 μm, and the larger the exceeding distance B is, the larger the down border is.

In an exemplary implementation mode, although a position of the pixel drive circuit boundary may be adjusted by using a solution of moving a pixel drive circuit up as a whole to make the display region boundary BD be overlapped with the pixel drive circuit boundary PD, in order to achieve a connection between an anode and the pixel drive circuit, this processing solution needs to change a position of an anode connection electrode, so that a distance between anode openings is reduced, which not only increases signal crosstalk, but also leads to a defect of short circuit. In addition, the solution of moving the pixel drive circuit up as a whole will make a pixel opening of a pixel definition layer move up as a whole, which will reduce a distance between a Fine Metal Mask (FMM) and the display region boundary, and under existing process conditions, a display region is caused to be relatively dark due to a shadow in an evaporation process, and there is a great risk of poor display.

As may be seen from a structure and the preparation process of the display substrate according to the present disclosure, the display substrate provided by the exemplary embodiment of the present disclosure may effectively reduce a width of a down border by changing a layout of pixel drive circuits. According to the present disclosure, a first scan signal line 21, a second scan signal line 32, a fourth scan signal line 33, a first initial signal line 31, and a second initial signal line 57 of a sub-pixel in an i-th pixel row are located on a side of a storage capacitor 40 of a present sub-pixel close to a display region boundary BD, a light emitting control line 22 is located on a side of the storage capacitor 40 of the present sub-pixel away from the display region boundary BD, a first transistor T1, a second transistor T2, and a fourth transistor T4 are located on a side of a third transistor T3 of the present sub-pixel close to the display region boundary BD, and a fifth transistor T5, a sixth transistor T6, and a seventh transistor T7 are located on a side of the third transistor T3 of the present sub-pixel away from the display region boundary BD, so that the seventh transistor T7 of the sub-pixel in the i-th pixel row (a present row) is driven by a first scan signal line 21 of a sub-pixel in an (i−1)-th pixel row (a previous row), thus not only a pixel drive circuit of a sub-pixel of an M-th pixel row (a last row) does not need to be additionally provided a signal line of a next row, but also a pixel drive circuit boundary PD may be located in a display region, that is, the pixel drive circuit boundary PD is located on a side of the display region boundary BD away from a bonding region. According to the layout of drive circuits of the exemplary embodiment of the present disclosure, the bonding region not only may be arranged correspondingly by taking the display region boundary BD as a basis, but also may be arranged correspondingly by taking the pixel drive circuit boundary PD as a basis, thereby effectively reducing a width of a down border. In an exemplary implementation mode, a distance L between the display region boundary BD and the pixel drive circuit boundary PD may be about 6 μm to 10 μm. For example, the distance L may be about 7.99 μm. Compared with an existing structure in which a pixel drive circuit boundary PD exceeds a display region boundary BD by about 20 μm to 30 μm, the display substrate according to the exemplary embodiment of the present disclosure may reduce a width of a down border by about 30 μm to 40 μm, which is beneficial to achieve a narrow border. In addition, the layout of pixel drive circuits provided by the exemplary embodiments of the present disclosure not only ensures a safe distance between anode openings and a safe distance between a fine metal mask and a display region boundary, which avoids a defect of short circuit and a risk of poor display in an evaporation process, but also may effectively save layout space, which is beneficial to achieving a high resolution. The preparation process of the present disclosure may be well compatible with an existing preparation process, which is simple in process implementation, easy to implement, high in production efficiency, low in production cost, and high in yield.

The aforementioned structure shown in the present disclosure and the preparation process thereof are merely exemplary description. In an exemplary implementation mode, corresponding structures may be changed and patterning processes may be added or reduced according to actual needs, which is not limited here in the present disclosure.

In an exemplary implementation mode, the display substrate of the present disclosure may be applied to another display apparatus having a pixel drive circuit, such as quantum dot display, which is not limited in the present disclosure.

The present disclosure also provides a preparation method of a display substrate, for preparing the display substrate according to the foregoing embodiments. In an exemplary implementation mode, the display substrate includes a display region and a bonding region located on a side of the display region, wherein the display region includes M pixel rows, and M is a positive integer greater than 1; at least one pixel row includes a scan signal line and a plurality of sub-pixels arranged sequentially along an extension direction of the scan signal line, wherein at least one sub-pixel includes a pixel drive circuit connected with the scan signal line, the pixel drive circuit at least includes a storage capacitor and a plurality of transistors, the plurality of transistors at least include a first transistor as a first initialization transistor, and the scan signal line at least includes a second scan signal line configured to control the first transistor to be turned on or off, the preparation method includes: forming a pixel drive circuit and a second scan signal line in at least one pixel row, wherein the second scan signal line is arranged on a side of the storage capacitor close to a display region boundary, and the display region boundary is a boundary of the display region close to the bonding region.

The present disclosure also provides a display apparatus which includes the aforementioned display substrate. The display apparatus may be any product or component with a display function, such as a mobile phone, a tablet computer, a television, a display, a laptop computer, a digital photo frame, or a navigator, which is not limited in the embodiments of the present disclosure.

Although implementation modes disclosed in the present disclosure are described as above, the described contents are only implementation modes which are used for facilitating the understanding of the present disclosure, but are not intended to limit the present disclosure. Any skilled person in the art to which the present disclosure pertains may make any modification and variation in forms and details of implementation without departing from the spirit and scope of the present disclosure. However, the scope of patent protection of the present disclosure should be subject to the scope defined in the appended claims.

The invention claimed is:

1. A display substrate, comprising a display region and a bonding region located on a side of the display region, wherein the display region comprises M pixel rows arranged sequentially, and M is a positive integer greater than 1; at least one pixel row comprises a scan signal line and a plurality of sub-pixels arranged sequentially along an extension direction of the scan signal line, wherein at least one sub-pixel comprises a pixel drive circuit connected with the scan signal line, the pixel drive circuit at least comprises a storage capacitor and a plurality of transistors, the plurality of transistors at least comprise a first transistor as a first initialization transistor, a second transistor as a compensation transistor, a third transistor as a drive transistor, a fourth transistor as a data writing transistor, and a seventh transistor as a second initialization transistor, the scan signal line at least comprises a first scan signal line which is configured to control the seventh transistor to be turned on or off, a second scan signal line which is configured to control the first transistor to be turned on or off, a third scan signal line which is configured to control the fourth transistor to be turned on or off and a fourth scan signal line which is configured to control the second transistor to be turned on or off; and in at least one pixel row, the first scan signal line, the fourth scan signal line, the third scan signal line and the second scan signal line are arranged sequentially in a direction close to a display region boundary, the second scan signal line is arranged on a side of the storage capacitor close to the display region boundary, and the display region boundary is an edge of the display region close to the bonding region.

2. The display substrate according to claim 1, wherein a first electrode of the first transistor is connected with a first initial signal line, and the first initial signal line is arranged on a side of the storage capacitor close to the display region boundary.

3. The display substrate according to claim 2, wherein an edge of a first initial signal line in an M-th pixel row close to a side of the bonding region forms a pixel drive circuit boundary.

4. The display substrate according to claim 3, wherein the pixel drive circuit boundary is located on a side of the display region boundary away from the bonding region.

5. The display substrate according to claim 4, wherein a distance between the pixel drive circuit boundary and the display region boundary is 6 μm to 10 μm.

6. The display substrate according to claim 1, wherein the first scan signal line is arranged on a side of the storage capacitor away from the display region boundary.

7. The display substrate according to claim 6, wherein a first electrode of the seventh transistor is connected with a second initial signal line, the second initial signal line is arranged on a side of the storage capacitor away from the display region boundary.

8. The display substrate according to claim 7, wherein an orthographic projection of a second initial signal line in an i-th pixel row on the display substrate is at least partially overlapped with an orthographic projection of a second scan signal line in an (i−1)-th pixel row on the display substrate, and i=2, 3, . . . , M.

9. The display substrate according to claim 6, wherein the third scan signal line and the fourth scan signal line are arranged on a side of the storage capacitor close to the display region boundary.

10. The display substrate according to claim 9, wherein the third scan signal line is arranged on a side of the fourth scan signal line close to the display region boundary.

11. The display substrate according to claim 9, wherein a first scan signal line in an i-th pixel row and a third scan signal line in an (i−1)-th pixel row are of an integral structure, and i=2, 3, . . . , M.

12. The display substrate according to claim 1, wherein the plurality of transistors further comprise a fifth transistor and a sixth transistor, the display substrate further comprises a light emitting control line, the light emitting control line is configured to control the fifth transistor and the sixth transistor to be turned on or off, and the light emitting control line is arranged on a side of the storage capacitor away from the display region boundary.

13. The display substrate according to claim 1, wherein the plurality of transistors further comprise a fifth transistor and a sixth transistor as light emitting transistors; and the first transistor, the second transistor, and the fourth transistor are arranged on a side of the third transistor close to the display region boundary, and the fifth transistor, the sixth transistor, and the seventh transistor are arranged on a side of the third transistor away from the display region boundary.

14. The display substrate according to claim 13, wherein the first transistor and the second transistor are oxide transistors and the third transistor to the seventh transistor are low-temperature poly silicon transistors.

15. The display substrate according to claim 1, wherein in a plane perpendicular to the display substrate, the display substrate comprises a drive circuit layer arranged on a base substrate and a light emitting structure layer arranged on a side of the drive circuit layer away from the base substrate; the drive circuit layer comprises a first semiconductor layer, a first conductive layer, a second conductive layer, a second semiconductor layer, and a third conductive layer which are arranged along a direction away from the base substrate; and the first semiconductor layer at least comprises active layers of a plurality of poly silicon transistors, the first conductive layer at least comprises a first scan signal line, a third scan signal line, gate electrodes of the plurality of poly silicon transistors, and a first electrode plate of the storage capacitor, the second conductive layer at least comprises a second scan signal line, a fourth scan signal line, a first initial signal line, gate electrodes of a plurality of oxide transistors, and a second electrode plate of the storage capacitor, the second semiconductor layer at least comprises active layers of the plurality of oxide transistors, and the third conductive layer at least comprises a second initial signal line.

16. A display apparatus, comprising the display substrate according to claim 1.

17. A preparation method of the display substrate according to claim 1, comprising:

forming the pixel drive circuit and the second scan signal line in the at least one pixel row.

18. The display substrate according to claim 2, wherein the first scan signal line is arranged on a side of the storage capacitor away from the display region boundary.

19. The display substrate according to claim 3, wherein the first scan signal line is arranged on a side of the storage capacitor away from the display region boundary.

20. The display substrate according to claim 4, wherein the first scan signal line is arranged on a side of the storage capacitor away from the display region boundary.

* * * * *